United States Patent
Kerber et al.

(10) Patent No.: US 9,276,118 B2
(45) Date of Patent: Mar. 1, 2016

(54) FINFET DEVICE HAVING A MERGE SOURCE DRAIN REGION UNDER CONTACT AREAS AND UNMERGED FINS BETWEEN CONTACT AREAS, AND A METHOD OF MANUFACTURING SAME

(71) Applicant: GLOBALFOUNDRIES INC., Grand Cayman (KY)

(72) Inventors: Pranita Kerber, Mount Kisco, NY (US); Qiqing C. Ouyang, Yorktown Heights, NY (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/640,851

(22) Filed: Mar. 6, 2015

(65) Prior Publication Data

US 2015/0179789 A1  Jun. 25, 2015

Related U.S. Application Data

(62) Division of application No. 14/022,945, filed on Sep. 10, 2013, now Pat. No. 8,993,406.

(51) Int. Cl.
*H01L 27/01* (2006.01)
*H01L 29/78* (2006.01)
*H01L 29/66* (2006.01)
*H01L 29/08* (2006.01)

(52) U.S. Cl.
CPC .......... *H01L 29/785* (2013.01); *H01L 29/0847* (2013.01); *H01L 29/66795* (2013.01); *H01L 29/7853* (2013.01)

(58) Field of Classification Search
CPC ..... H01L 27/1203; H01L 27/12; H01L 21/84; H01L 21/775; H01L 29/66772
USPC .......................................... 257/347; 438/283
See application file for complete search history.

(56) References Cited

U.S. PATENT DOCUMENTS

| | | | |
|---|---|---|---|
| 8,080,838 B2 | 12/2011 | Chang et al. | |
| 8,212,295 B2 | 7/2012 | Liaw | |
| 8,263,451 B2 | 9/2012 | Su et al. | |
| 8,377,759 B2 | 2/2013 | Cheng et al. | |
| 8,455,313 B1 | 6/2013 | Basker et al. | |
| 8,486,769 B2 | 7/2013 | Wang et al. | |
| 8,703,556 B2 * | 4/2014 | Kelly | H01L 29/66795 257/296 |
| 2011/0204419 A1 | 8/2011 | Johnson et al. | |
| 2011/0210404 A1 | 9/2011 | Su et al. | |
| 2011/0284967 A1 | 11/2011 | Cheng et al. | |

(Continued)

*Primary Examiner* — Quoc Hoang
(74) *Attorney, Agent, or Firm* — Scully Scott Murphy and Presser; Frank Digiglio

(57) ABSTRACT

A method for manufacturing a fin field-effect transistor (FinFET) device, comprises forming a plurality of fins on a substrate, forming a plurality of gate regions on portions of the fins, wherein the gate regions are spaced apart from each other, forming spacers on each respective gate region, epitaxially growing a first epitaxy region on each of the fins, stopping growth of the first epitaxy regions prior to merging of the first epitaxy regions between adjacent fins, forming a dielectric layer on the substrate including the fins and first epitaxy regions, removing the dielectric layer and first epitaxy regions from the fins at one or more portions between adjacent gate regions to form one or more contact area trenches, and epitaxially growing a second epitaxy region on each of the fins in the one or more contact area trenches, wherein the second epitaxy regions on adjacent fins merge with each other.

18 Claims, 25 Drawing Sheets

(56) References Cited

U.S. PATENT DOCUMENTS

2012/0043610 A1 2/2012 Cheng et al.
2012/0223395 A1 9/2012 Liaw
2013/0001705 A1 1/2013 Su et al.
2013/0154006 A1 6/2013 Basker et al.

* cited by examiner

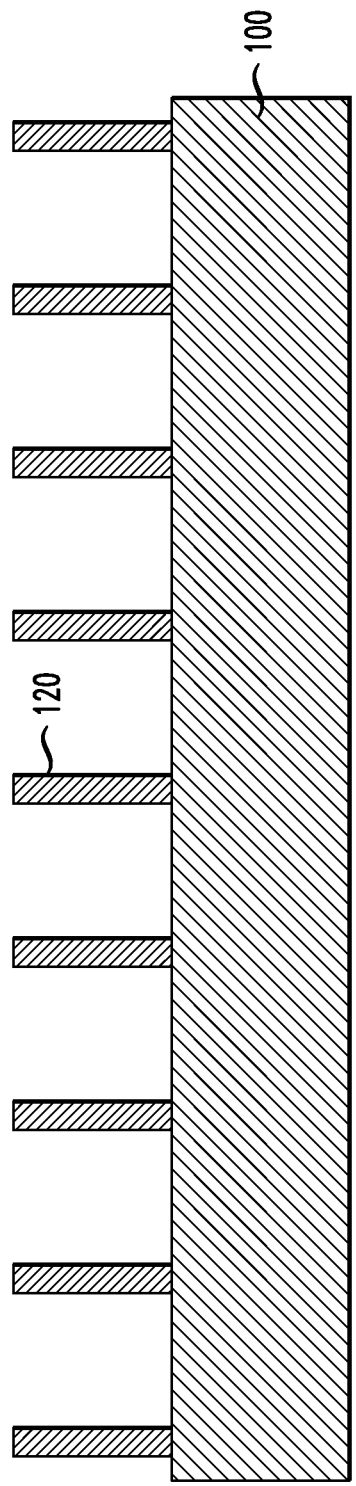

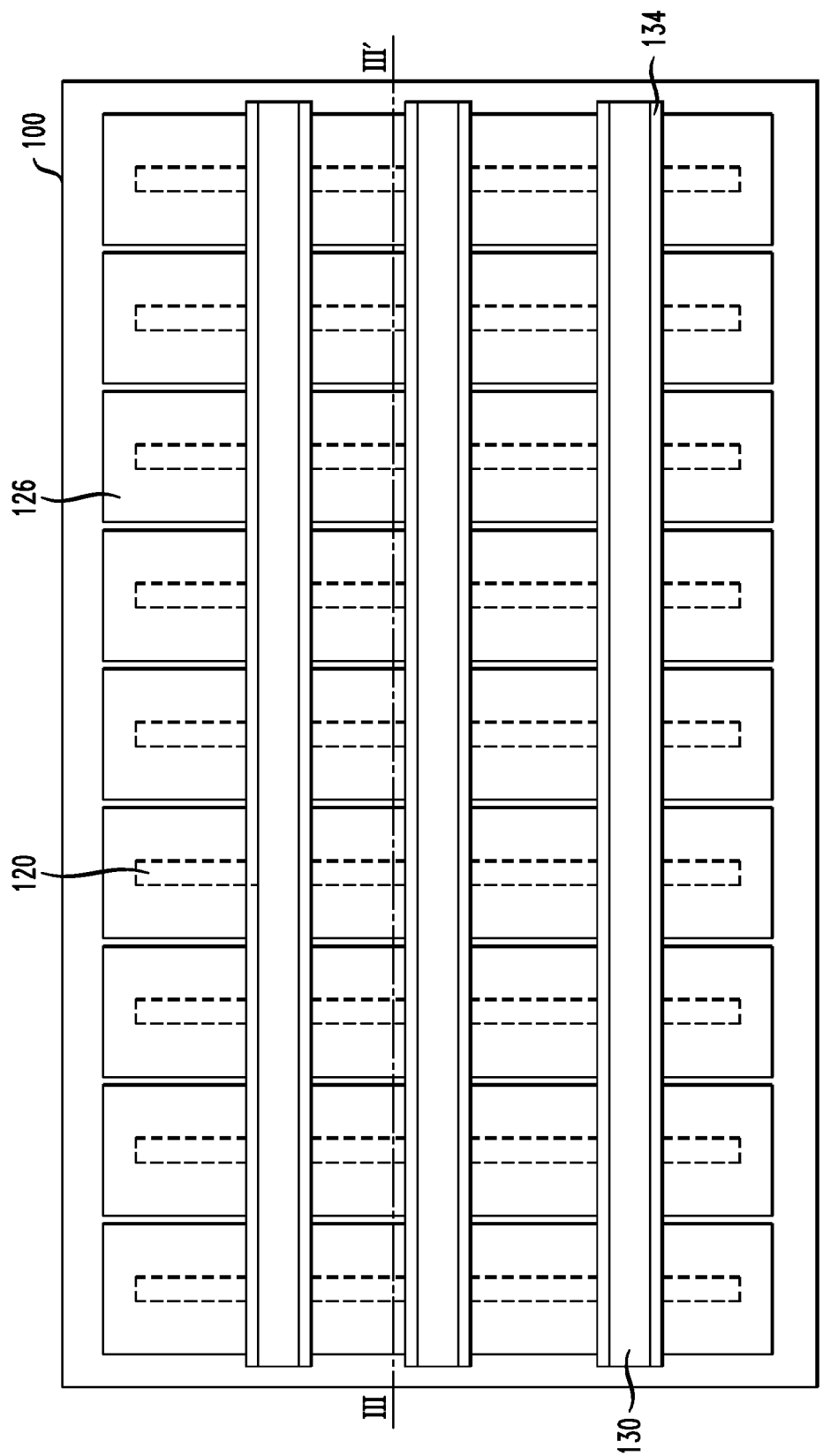

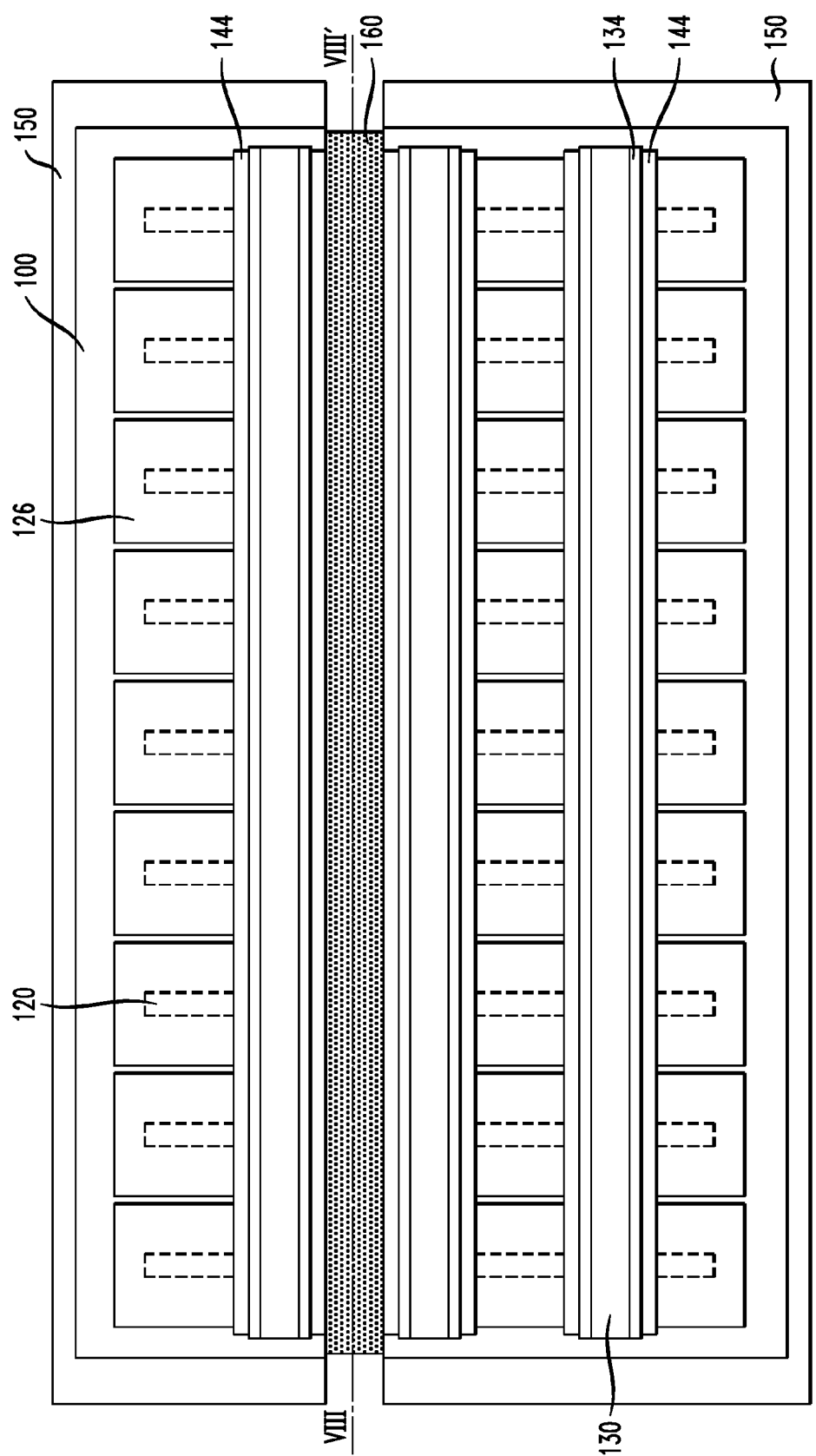

US 9,276,118 B2

FINFET DEVICE HAVING A MERGE SOURCE DRAIN REGION UNDER CONTACT AREAS AND UNMERGED FINS BETWEEN CONTACT AREAS, AND A METHOD OF MANUFACTURING SAME

CROSS-REFERENCE TO RELATED APPLICATION

This application is a Divisional of U.S. patent application Ser. No. 14/022,945, filed on Sep. 10, 2013, the disclosure of which is incorporated herein by reference in its entirety.

TECHNICAL FIELD

The field generally relates to fin field-effect transistor (FinFET) devices and methods of manufacturing same and, in particular, to a FinFET device having a merged source drain region under contact areas and unmerged fins between contact areas, and a method of manufacturing same.

BACKGROUND

In known semiconductor devices, such as, for example, FinFET complementary metal-oxide-semiconductor (CMOS) devices, source drain (SD) regions are merged to reduce semiconductor resistance and decrease silicide contact resistance. However, the epitaxial merging and with it the needed overgrowth above the fins results in an increase of drain to gate capacitance because of an additional epitaxial region to gate capacitance component.

Accordingly, there is a need for a semiconductor device which can exhibit reduced semiconductor resistance and decreased silicide contact resistance without an increase in drain to gate capacitance.

SUMMARY

In general, exemplary embodiments of the invention include fin field-effect transistor (FinFET) devices and methods of manufacturing same and, in particular, to FinFET devices having a merged source drain region under contact areas and unmerged fins between contact areas, and a method of manufacturing same.

According to an exemplary embodiment of the present invention, a method for manufacturing a fin field-effect transistor (FinFET) device, comprises forming a plurality of fins on a substrate, forming a plurality of gate regions on portions of the fins, wherein the gate regions are spaced apart from each other, forming spacers on each respective gate region, epitaxially growing a first epitaxy region on each of the fins, stopping growth of the first epitaxy regions prior to merging of the first epitaxy regions between adjacent fins, forming a dielectric layer on the substrate including the fins and the first epitaxy regions, removing the dielectric layer and the first epitaxy regions from the fins at one or more portions between adjacent gate regions to form one or more contact area trenches, and epitaxially growing a second epitaxy region on each of the fins in the one or more contact area trenches, wherein the second epitaxy regions on adjacent fins merge with each other.

According to an exemplary embodiment of the present invention, a fin field-effect transistor (FinFET) device comprises a substrate, a plurality of fins on the substrate, a plurality of gate regions on portions of the fins, wherein the gate regions are spaced apart from each other, spacers on each respective gate region, one or more contact area trenches respectively formed at one or more portions between adjacent gate regions, an epitaxy region on each of the fins in the one or more contact area trenches, wherein the epitaxy regions on adjacent fins in the one or more contact area trenches are merged with each other to form merged epitaxy regions, and an unmerged epitaxy region on portions of each of the fins between the one or more contact area trenches.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIGS. 1A and 1B are top and cross-sectional views, respectively, illustrating fin formation in a method of manufacturing a FinFET device, according to an exemplary embodiment of the present invention.

FIGS. 4A and 4B are top and cross-sectional views, respectively, illustrating epitaxial growth on the fins in the source drain region in a method of manufacturing a FinFET device, according to an exemplary embodiment of the invention.

FIGS. 9A and 9B are top and cross-sectional views, respectively, illustrating formation of a silicide layer on the merged epitaxy region in a method of manufacturing a FinFET device, according to an exemplary embodiment of the invention.

DETAILED DESCRIPTION OF EXEMPLARY EMBODIMENTS

Figure 1A:
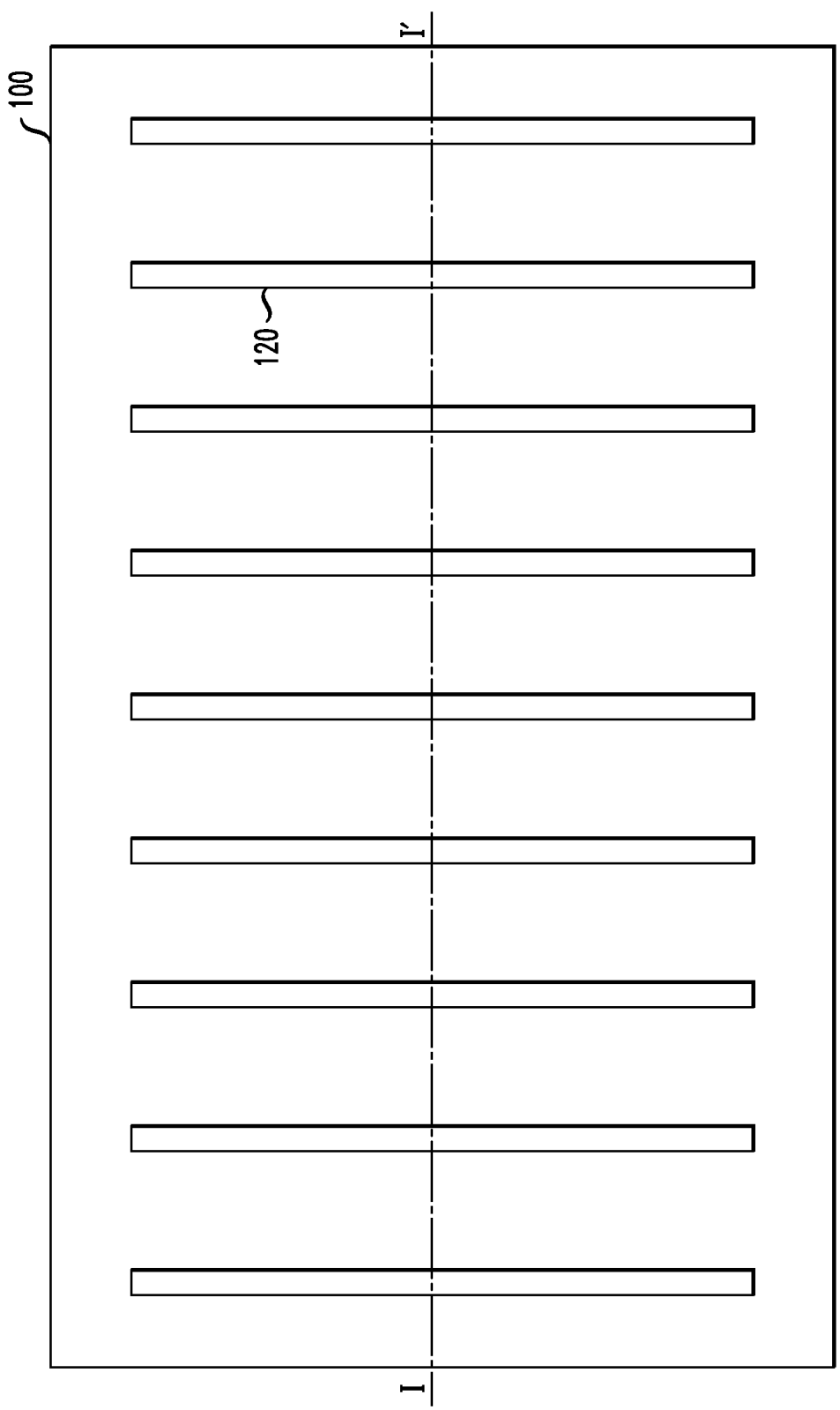

Exemplary embodiments of the invention will now be discussed in further detail with regard to fin field-effect transistor (FinFET) devices and methods of manufacturing same and, in particular, to a FinFET device having a merged source drain region under contact areas and unmerged fins between contact areas, and a method of manufacturing same. This invention may, however, be embodied in many different forms and should not be construed as limited to the embodiments set forth herein.

The embodiments of the present invention include a FinFET device and method of manufacturing same which maintains a merged source drain region under the contact area (CA) regions and keeps the fins unmerged between contact areas to optimize an access resistance and capacitance tradeoff As a result, there is less parasitic source drain epitaxial region to gate capacitance (CG-EPI) with respect to an entire merged epitaxy region, and a lower Rext penalty compared to an unmerged fin design, due to a merged and in-situ doped epitaxy region contacting metal studs.

The embodiments of the present invention further result in little or no lateral outside growth to avoid unwanted shorts between neighboring transistors as well as a source to drain shorts caused by the merging of fins of different transistors, improved epitaxy region uniformity, and little or no loading effects during growth of an epitaxial region due to uniform contact area size.

It is to be understood that the various layers and/or regions shown in the accompanying drawings are not drawn to scale, and that one or more layers and/or regions of a type commonly used in FinFET devices may not be explicitly shown in a given drawing. This does not imply that the layers and/or regions not explicitly shown are omitted from the actual FinFET devices. Moreover, the same or similar reference numbers used throughout the drawings are used to denote the same or similar features, elements, or structures, and thus, a detailed explanation of the same or similar features, elements, or structures will not be repeated for each of the drawings.

The FinFET devices and methods for forming same in accordance with the embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the FinFET devices are contemplated embodiments of the invention. Given the teachings of the embodiments of the invention provided herein, one of ordinary skill in the art will be able to contemplate other implementations and applications of embodiments of the invention.

A silicon-on-insulator (SOI) substrate or a bulk substrate can be used as the semiconductor substrate 100 of the FinFET device. The SOI substrate includes a handle substrate, a buried insulating layer, such as, for example, a buried oxide or nitride layer, located on an upper surface of the handle substrate, and a semiconductor layer located on an upper surface of the buried insulating layer. The handle substrate and the semiconductor layer may comprise the same or different semiconductor material including, but not limited to, Si, SiGe, SiC, SiGeC or other like semiconductor. In addition, multiple layers of the semiconductor materials can be used as the semiconductor material of the handle substrate and the semiconductor layer. The bulk semiconductor substrate omits the buried insulating layer and has a semiconductor material including, but not limited to, Si, SiGe, SiC, SiGeC or other like semiconductor. Multiple layers of these semiconductor materials can also form the bulk semiconductor substrate. If the substrate is a bulk substrate, the plurality of fins may formed on the bulk substrate using known processes (e.g. etch fins, oxide fill, recess oxide, etc.).

According to an embodiment of the present invention, a well implantation step can be performed to create doped NFET and PFET devices with different voltage thresholds (VT), and PFET devices may include a silicon germanium (SiGe) on insulator configuration.

Referring to FIGS. 1A and 1B, which are top and cross-sectional views, respectively, illustrating fin formation in a method of manufacturing a FinFET device, according to an exemplary embodiment of the present invention, fins 120 are formed on substrate 100 by patterning the SOI layer 107 or a top portion of the bulk substrate 110 depending on which type of substrate is used. Patterning is performed by, for example, image transfer and etching. Referring to FIG. 1A, the cross-section is taken along line I-I', perpendicular to the fins 120.

Figure 2:
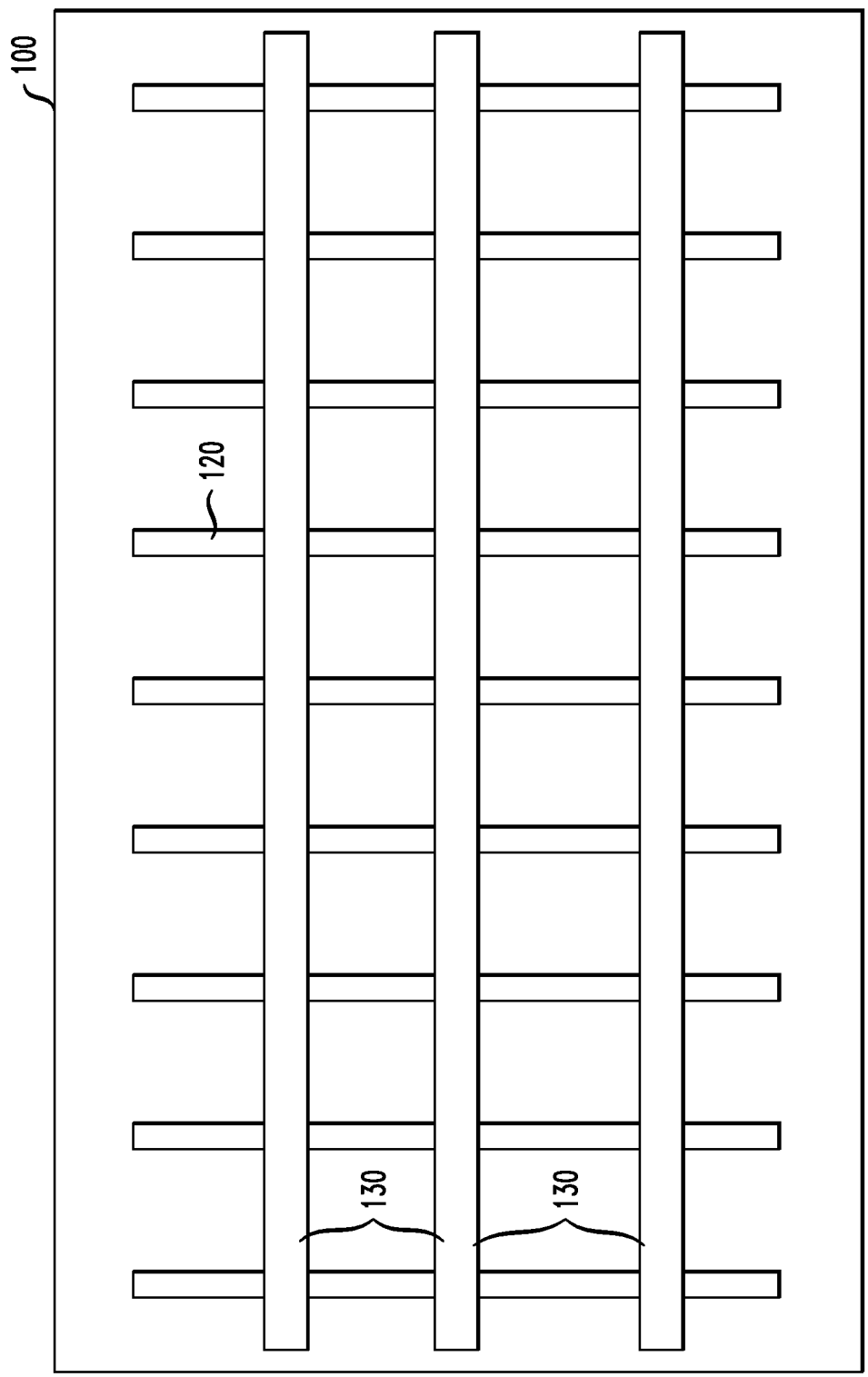
FIG. 2 is a top view illustrating gate formation in a method of manufacturing a FinFET device, according to an exemplary embodiment of the invention.
Figure 3A:
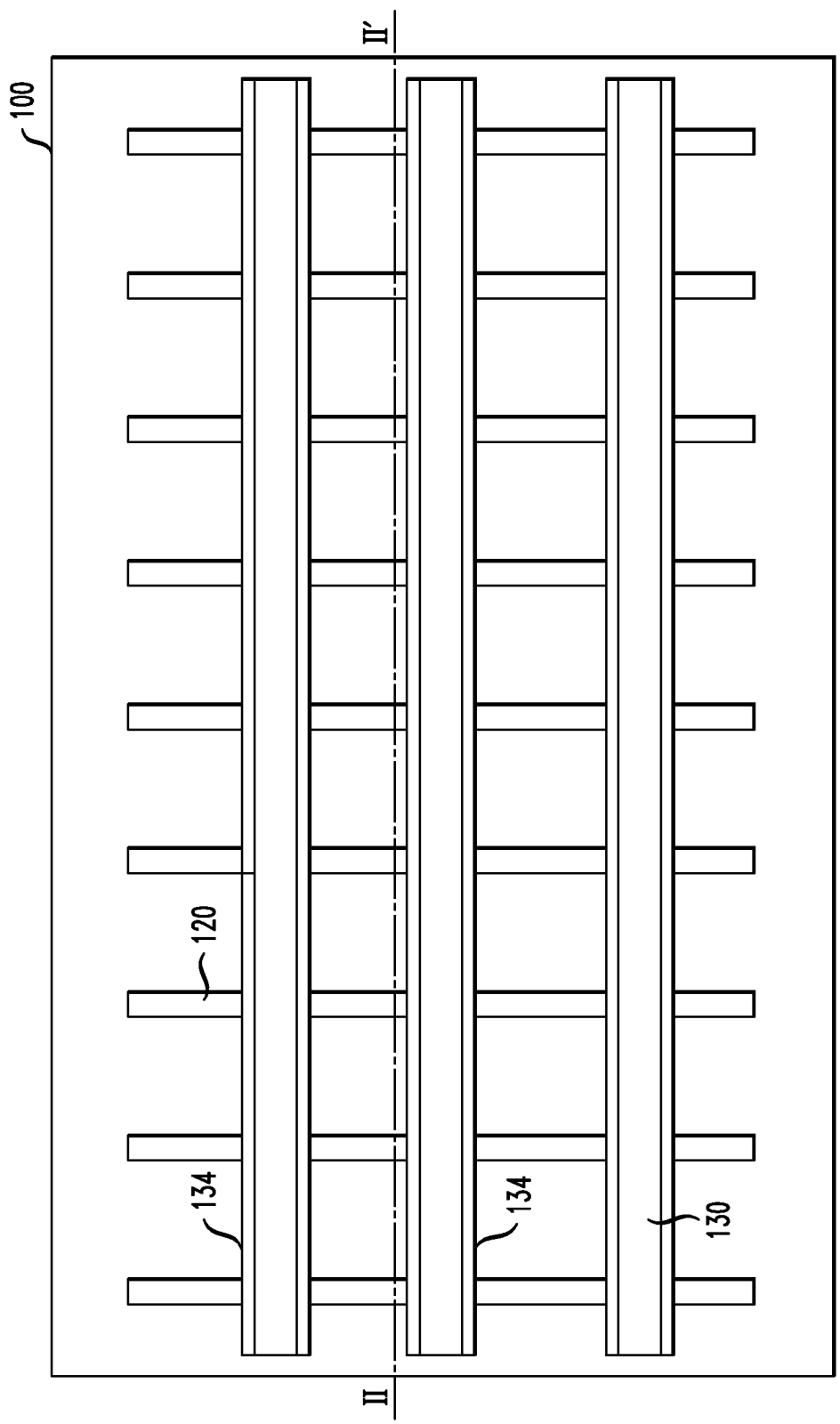
FIGS. 3A and 3B are top and cross-sectional views, respectively, illustrating deposition and patterning of a spacer region in a method of manufacturing a FinFET device, according to an exemplary embodiment of the invention.
Figure 3B:
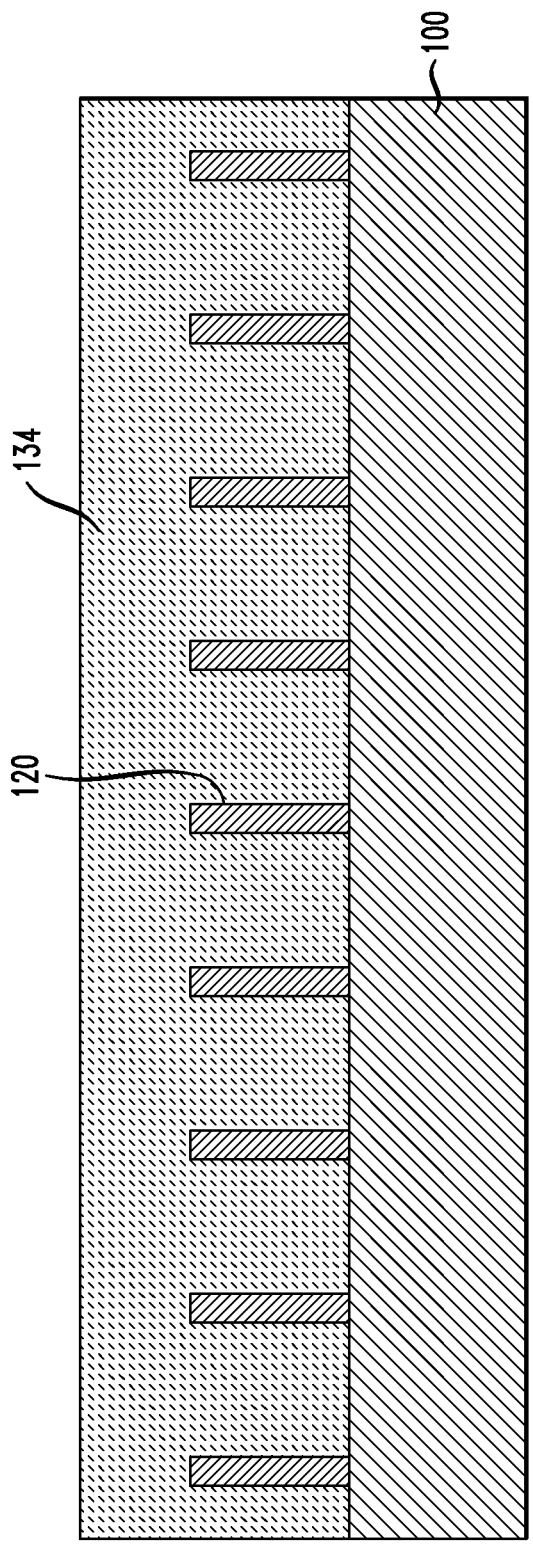

FIG. 2 is a top view illustrating gate formation, and FIGS. 3A and 3B are top and cross-sectional views, respectively, illustrating deposition and patterning of a spacer region in a method of manufacturing a FinFET device, according to an exemplary embodiment of the invention. A gate stack layer is deposited on the resulting structure from FIGS. 1A and 1B, and patterned to form gate stacks 130 around sides and on upper surfaces of designated portions of the fins 120 for the gate areas. In accordance with an embodiment, a gate hardmask (not shown), for example, a nitride, or any dielectric or combination of dielectric layers, is formed on each gate stack 130. The pitch between gates may vary according to design constraints. It is to be understood that the embodiments of the present invention are not limited to gate first processing, and may also be applied in conjunction with gate last processes as well.

Referring to FIGS. 3A and 3B, a spacer layer is deposited on the gate stacks 130 and patterned by, for example, reactive ion etching (RIE) to form spacer patterns 134 along sides of the gate stacks 130. The spacer patterns 134 isolate the gate stacks 130 from the source drain regions on either side of the gate stacks 130. The spacer patterns 134 can include a dielectric insulating material such as, for example, silicon oxide, silicon nitride, silicon oxynitride, boron nitride, and/or silicon boron nitride. The cross-section in FIG. 3B is taken along line II-II' perpendicular to the fins 120 and cutting through the fins 120.

Figure 4B:
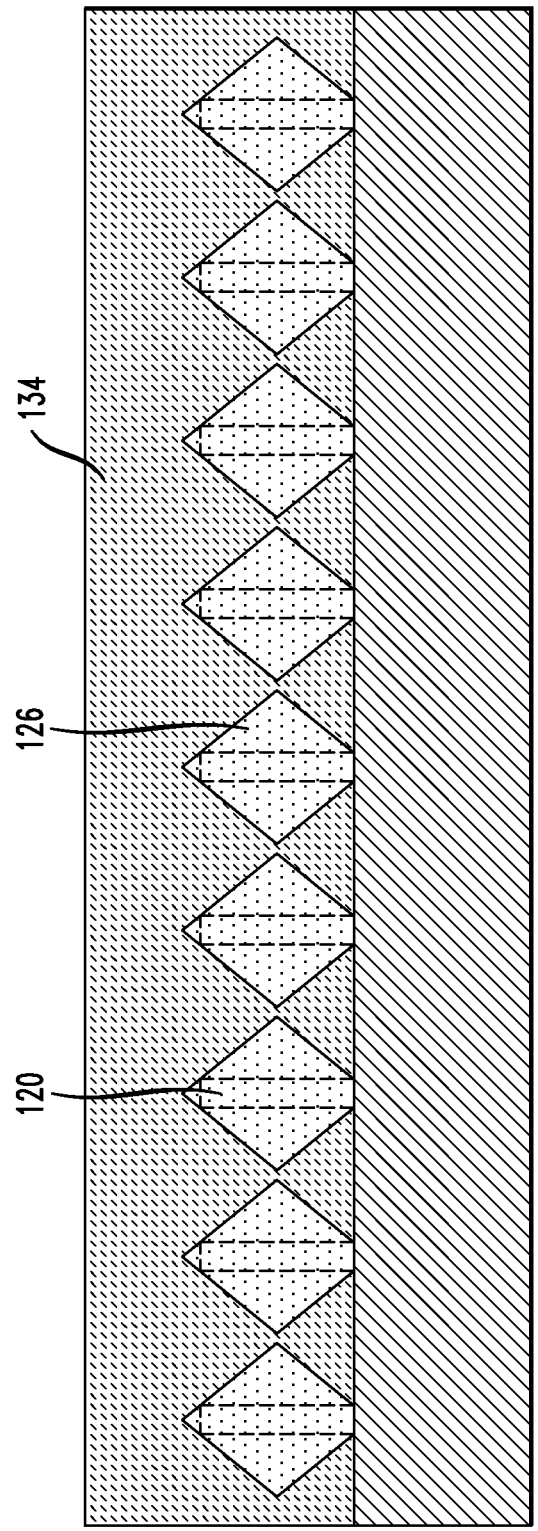

FIGS. 4A and 4B are top and cross-sectional views, respectively, illustrating epitaxial growth on the fins 120 in the source drain region in a method of manufacturing a FinFET device, according to an exemplary embodiment of the invention. FIG. 4B is a cross-section taken along line III-III' in FIG. 4A.

Silicon germanium and/or silicon is epitaxially grown on exposed surfaces, for example silicon surfaces, of the fins 120. As can be seen in FIGS. 4A and 4B, growth is stopped prior to merging of the epitaxial region 126 from each fin 120 so that the fins 120 do not contact each other through the epitaxial region 126. Referring to FIGS. 4A and 4B, spaces/separations are present between the epitaxial region 126 of a fin 120 and the epitaxial regions 126 of adjacent fins 120. According to an embodiment the growth process is timed and stopped after a predetermined period to avoid merging.

According to an embodiment, growth is performed with epitaxial in-situ impurity doped silicon. The epitaxy region 126 can be in-situ doped with, for example, boron for pFET or Arsenic/Phosphorus for nFET, or other appropriate impurity. According to another embodiment, growth is performed with in-situ boron doped SiGe. In accordance with an embodiment of the present invention, in-situ doping can be performed with a doping level of about $1 \times 10^{20}$ to about $1.5 \times 10^{21}$ cm$^3$, for example, about $4 \times 10^{20}$ to about $8 \times 10^{20}$ cm$^3$.

Figure 5A:
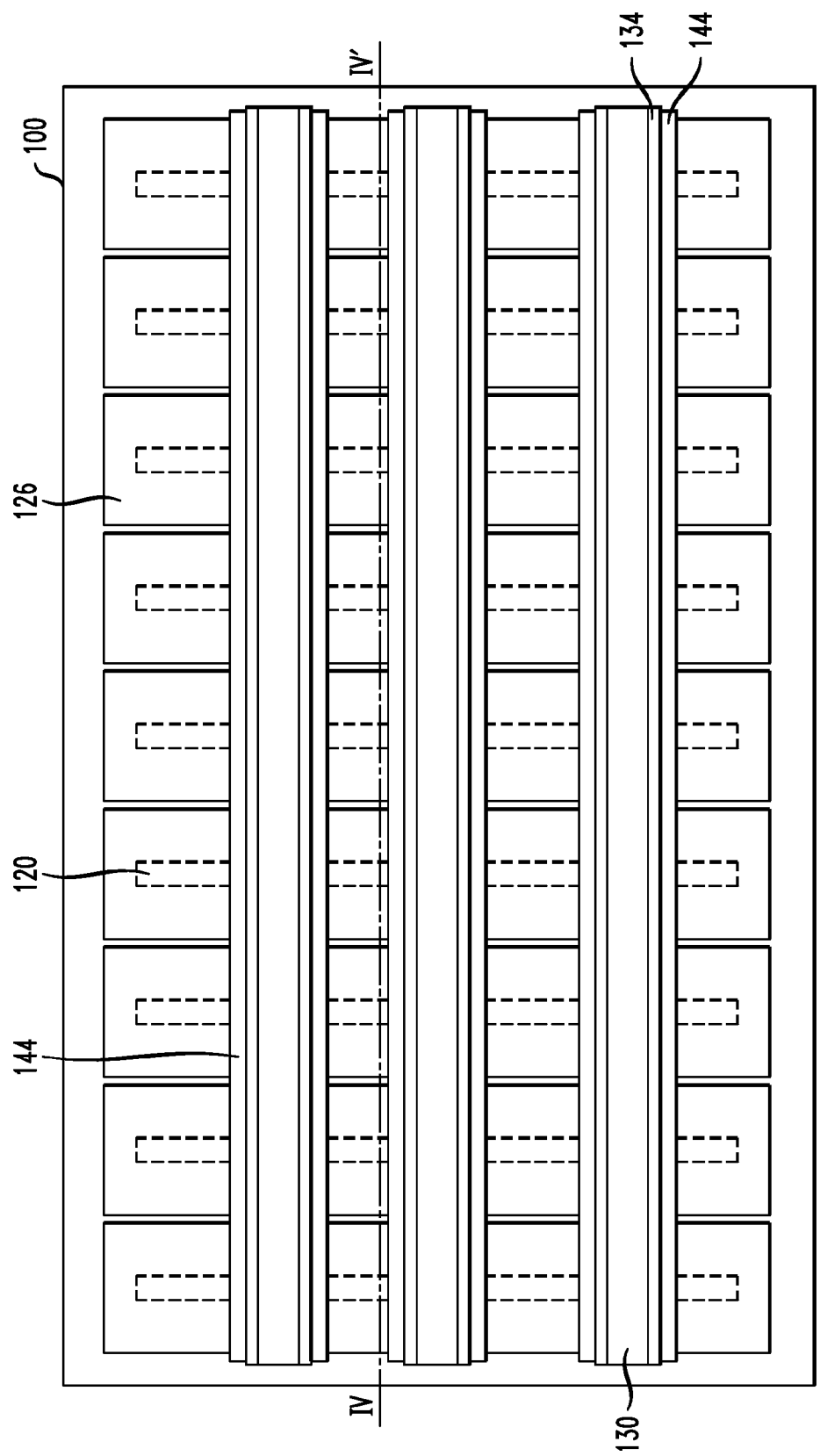
FIGS. 5A and 5B are top and cross-sectional views, respectively, illustrating formation of second spacers after epitaxy in a method of manufacturing a FinFET device, according to an exemplary embodiment of the invention.
Figure 5B:
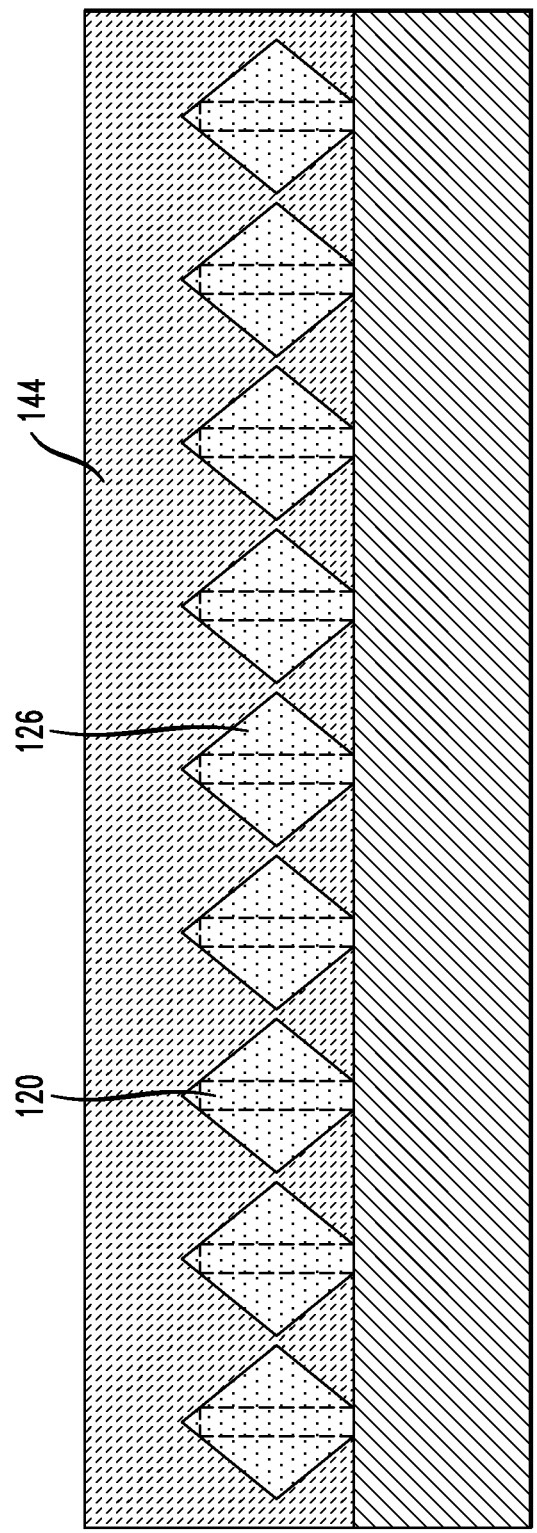

FIGS. 5A and 5B are top and cross-sectional views, respectively, illustrating formation of second spacers after epitaxy in a method of manufacturing a FinFET device, according to an exemplary embodiment of the invention. FIG. 5B is a cross-section taken along line IV-IV' in FIG. 5A.

A second spacer layer is deposited on the gate stacks 130 including the first spacers 134 and patterned by, for example, reactive ion etching (RIE) to form second spacer patterns 144 along sides of the first spacer patterns 134 on the gate stacks 130. Like the spacer patterns 134, the spacer patterns 144 isolate the gate stacks 130 from the source drain regions on either side of the gate stacks 130. The spacer patterns 144 can include a dielectric insulating material such as, for example, silicon oxide, silicon nitride, silicon oxynitride, boron nitride, and/or silicon boron nitride. In accordance with an embodiment, the second spacer patterns 144 are formed after epitaxial growth, As described in further detail below with respect to FIGS. 7A and 7B, the second spacer pattern 144 is used to align the contact area (CA) trenches, which are formed later. As a result, unmerged epitaxy regions (e.g., epitaxy regions 126 shaped as diamonds) are formed closer to the gates, and merged epitaxy regions are formed in a center area between the gates. The second spacer pattern 144 facilitates alignment of the CA trenches to protect/preserve the unmerged epitaxy regions.

Figure 6A:
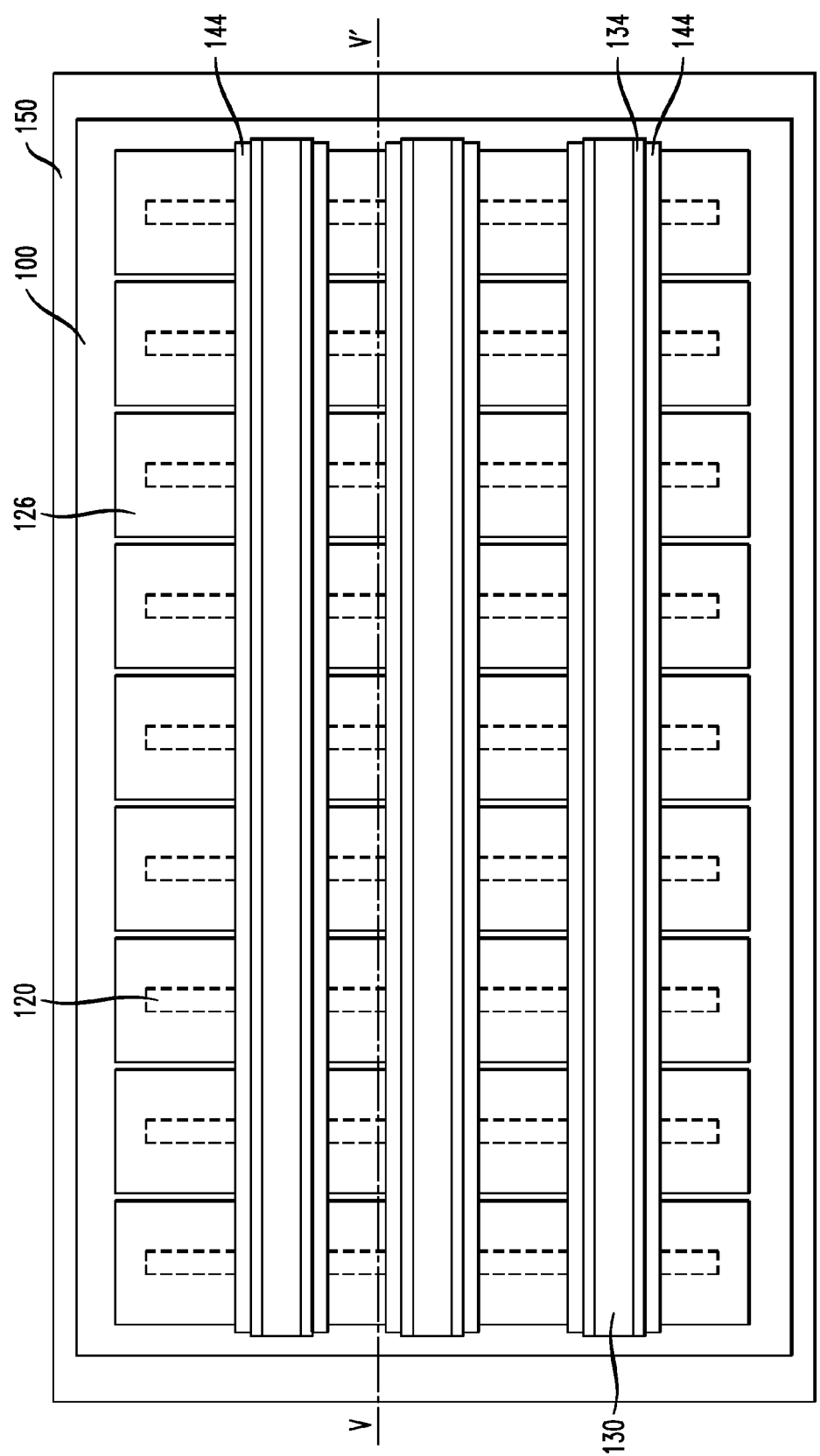
FIGS. 6A and 6B are top and cross-sectional views, respectively, illustrating formation of a middle-of-the-line (MOL) dielectric in a method of manufacturing a FinFET device, according to an exemplary embodiment of the invention.
Figure 6B:
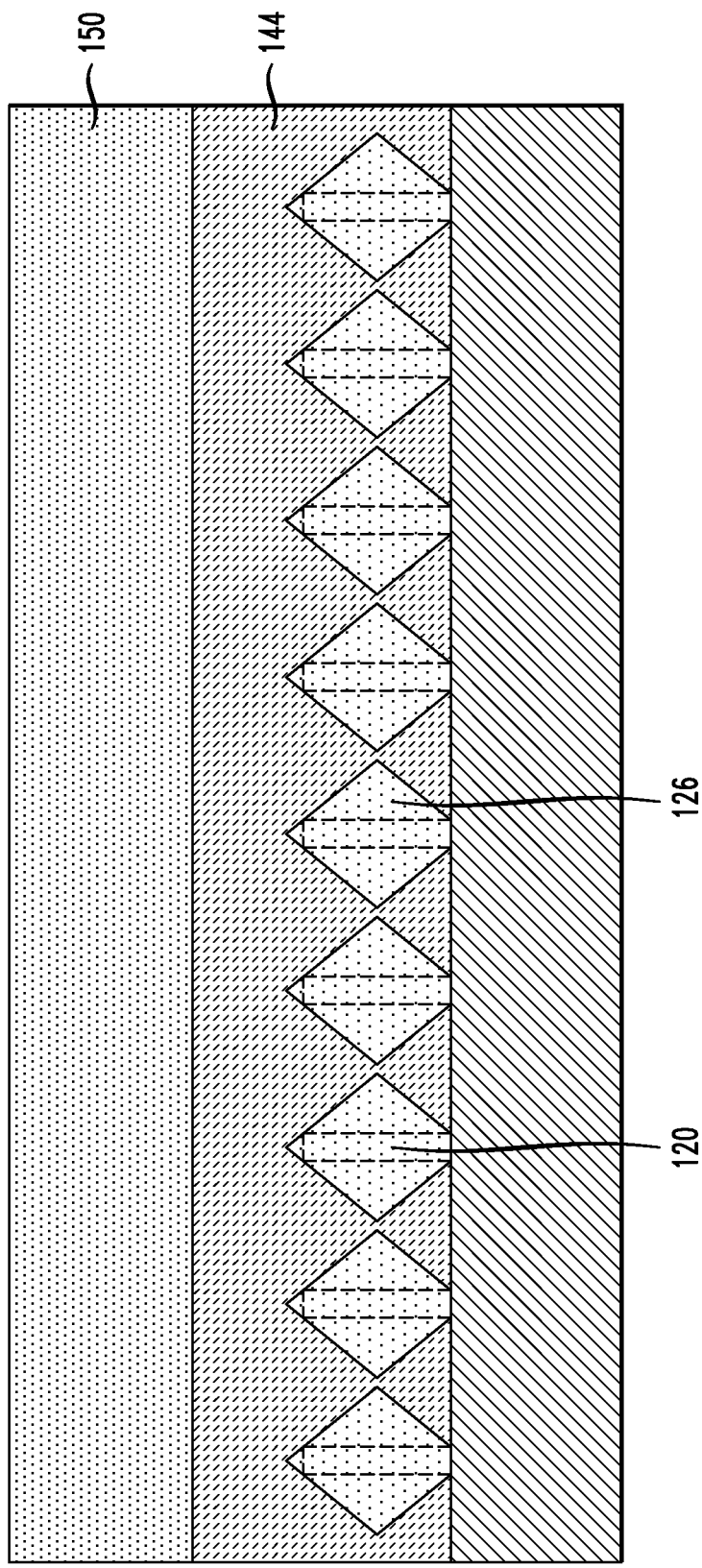

FIGS. 6A and 6B are top and cross-sectional views, respectively, illustrating formation of a middle-of-the-line (MOL) dielectric in a method of manufacturing a FinFET device, according to an exemplary embodiment of the invention. FIG. 6B is a cross-section taken along line V-V' in FIG. 6A. The MOL dielectric layer 150 is deposited using for example, CVD and can include, for example, silicon oxide, followed by CMP. In the top view in FIG. 6A, and in subsequent top views depicting the MOL dielectric 150, the MOL dielectric is shown as extending beyond the edges of the substrate 100 to distinguish the MOL dielectric 150 from the substrate 100 in the top view. It is to be understood that while the MOL dielectric can have the configuration depicted in the top views, the MOL dielectric can also be in line with or short of the edges of the substrate without extending beyond the edges as depicted in the top views. It is further noted, that depending on configurations of the device, the dielectric 150 is not necessarily limited to a middle-of-the-line dielectric, and can be a dielectric for another level such as, for example, a back-end-of-the-line.

Figure 7A:
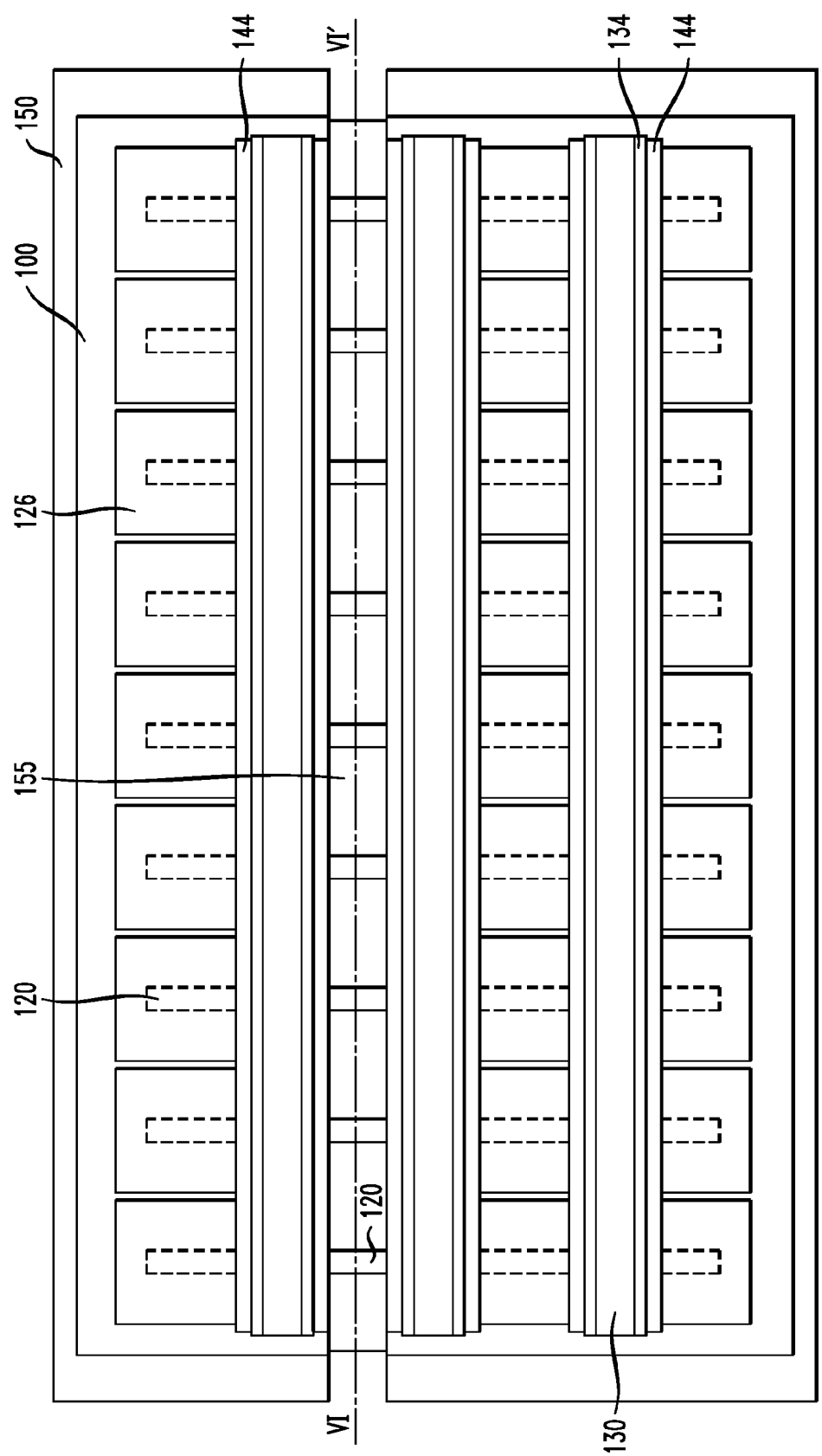
FIGS. 7A and 7B are top and cross-sectional views, respectively, illustrating formation of a contact area trench in a method of manufacturing a FinFET device, according to an exemplary embodiment of the invention.
Figure 7B:
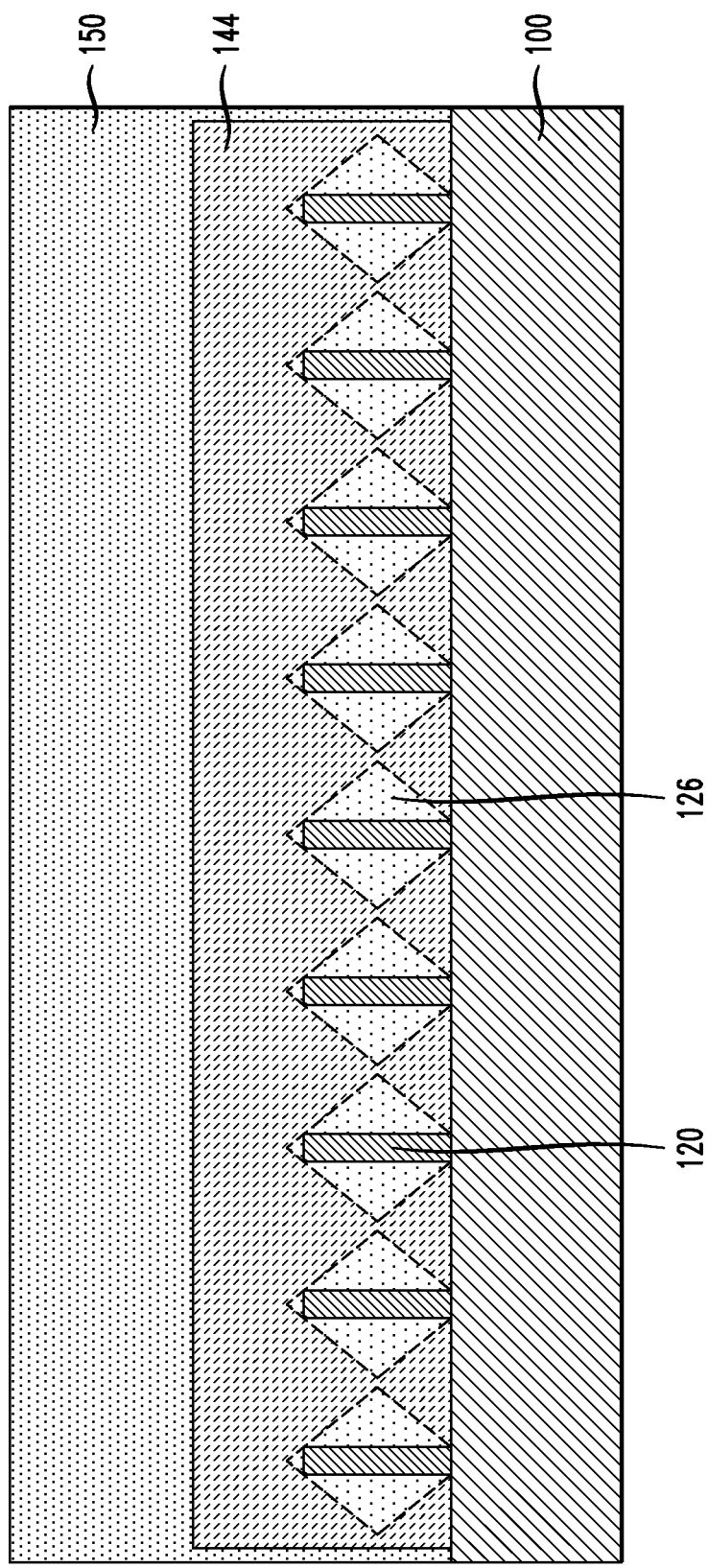

FIGS. 7A and 7B are top and cross-sectional views, respectively, illustrating formation of a contact area trench in a method of manufacturing a FinFET device, according to an exemplary embodiment of the invention. FIG. 7B is a cross-section taken along line VI-VI' in FIG. 7A.

In accordance with an embodiment of the present invention, referring to FIG. 7A, the MOL dielectric 150 is removed from a predetermined portion of the source drain region between the gates 130 to form the contact area (CA) trench 155. As can be seen, the second spacer 144 enables the CA trench 155 to be self-aligned. It is to be understood that a plurality of contact area trenches may be formed between different pairs of gates 130.

In accordance with an embodiment, the MOL dielectric 150 is removed using lithography, including, for example masking and RIE. Then, the epitaxy region 126 is removed from the trench area around the fins 120 using, for example, etching, including, but not limited to, directional RIE, etching SiGe or other doped material faster than the silicon fin. The epitaxy region, which according to an embodiment includes a material other than silicon, is selectively etched with respect to the fins 120, which include silicon. As a result, the fins 120 remain in the CA trench 155.

Figure 8A:
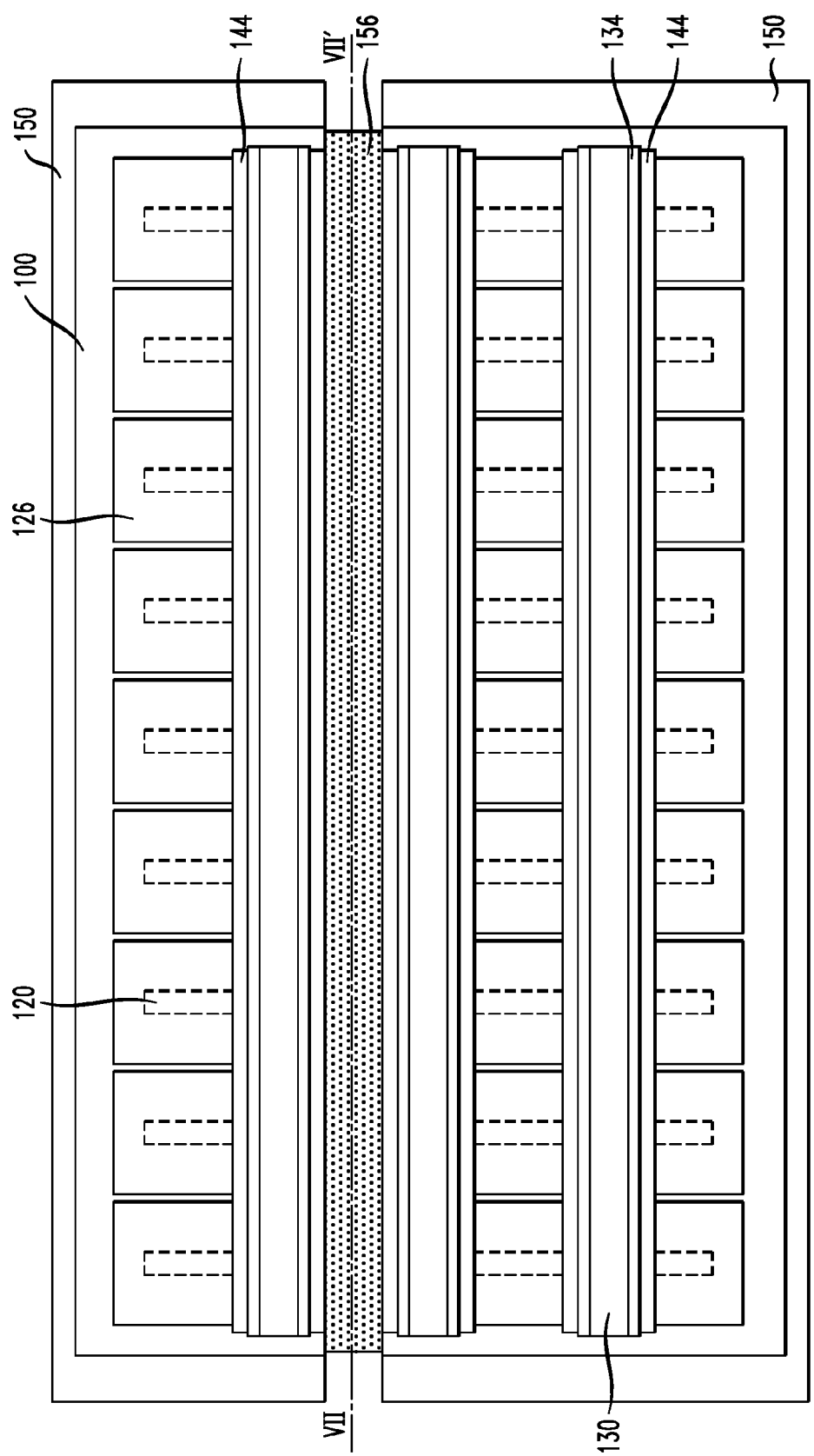
FIGS. 8A and 8B are top and cross-sectional views, respectively, illustrating formation of a merged epitaxy region in a contact area trench in a method of manufacturing a FinFET device, according to an exemplary embodiment of the invention.
Figure 8B:
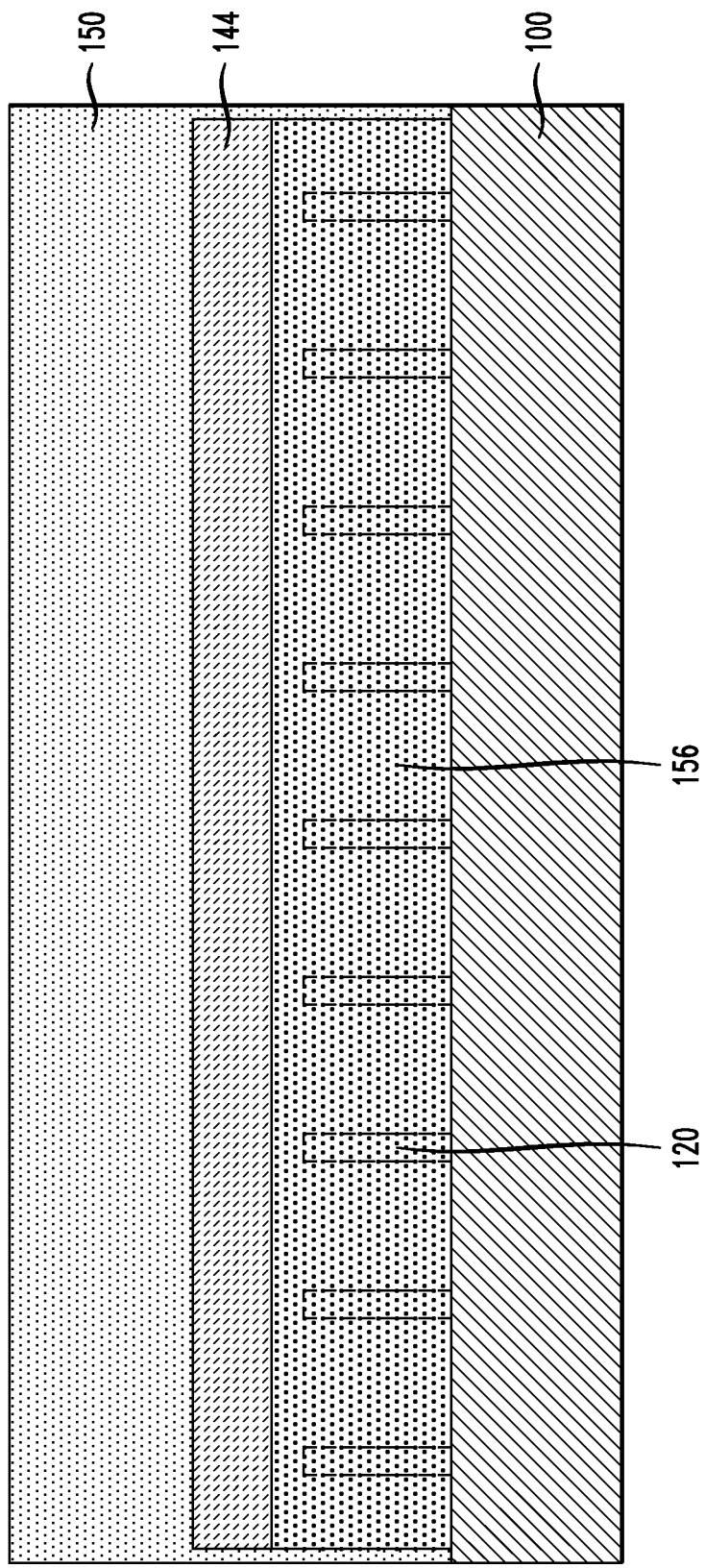

FIGS. 8A and 8B are top and cross-sectional views, respectively, illustrating formation of a merged epitaxy region in a contact area trench 155 in a method of manufacturing a FinFET device, according to an exemplary embodiment of the invention. FIG. 8B is a cross-section taken along line VII-VII' in FIG. 8A. It is to be understood that FIGS. 7A and 8A show one trench 155 and one merged epitaxy region 156 as an example, and that multiple trenches 155 and merged epitaxy regions 156 can be formed between different pairs of gates on the device.

The merged epitaxy region 156 is formed in a similar matter to the unmerged epitaxy region 126 described in connection with FIGS. 4A and 4B. For example, according to an embodiment, silicon germanium and/or silicon is epitaxially grown on exposed surfaces, for example silicon surfaces, of the fins 120 in the CA trench 155. As can be seen in FIGS. 8A and 8B, the exposed fins 120 of the CA trench 155 are merged by epitaxially growing silicon germanium and/or silicon on the exposed silicon surfaces of the fins 120 so that the fins 120 contact each other through the merged region 156 in an integrated structure.

In accordance with embodiments of the present invention, the epitaxy regions 126 and 156 can include the same or different materials (e.g., dopants and/or base materials), have the same or different doping (e.g., P vs. N) and/or have the same or different doping concentrations from each other (e.g., different doping levels). As noted above, the embodiments of the present invention include a FinFET device and method of manufacturing same which maintains a merged source drain region under the contact area (CA) regions and keeps the fins unmerged between contact areas to optimize an access resistance and capacitance tradeoff.

According to an embodiment, growth is performed with epitaxial in-situ impurity doped silicon. The epitaxy region 156 can be in-situ doped with, for example, boron for pFET or Arsenic/Phosphorus for nFET, or other appropriate impurity. According to another embodiment, growth is performed with in-situ boron doped SiGe. In accordance with an embodiment of the present invention, in-situ doping can be performed with a doping level of about $1 \times 10^{20}$ to about $1.5 \times 10^{21}$ cm$^3$, for example, about $4 \therefore 10^{20}$ to about $8 \times 10^{20}$ cm$^3$.

Figure 9B:
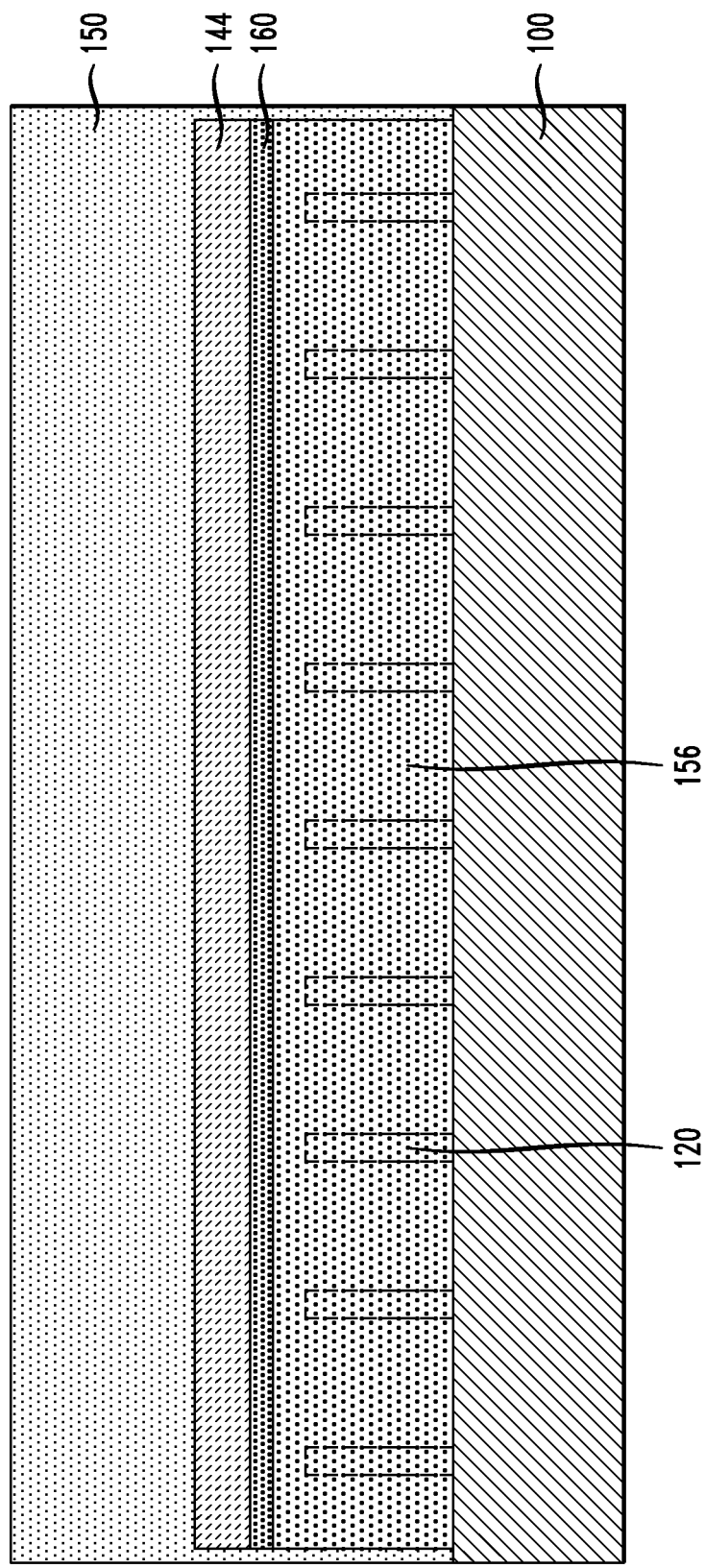
Figure 10A:
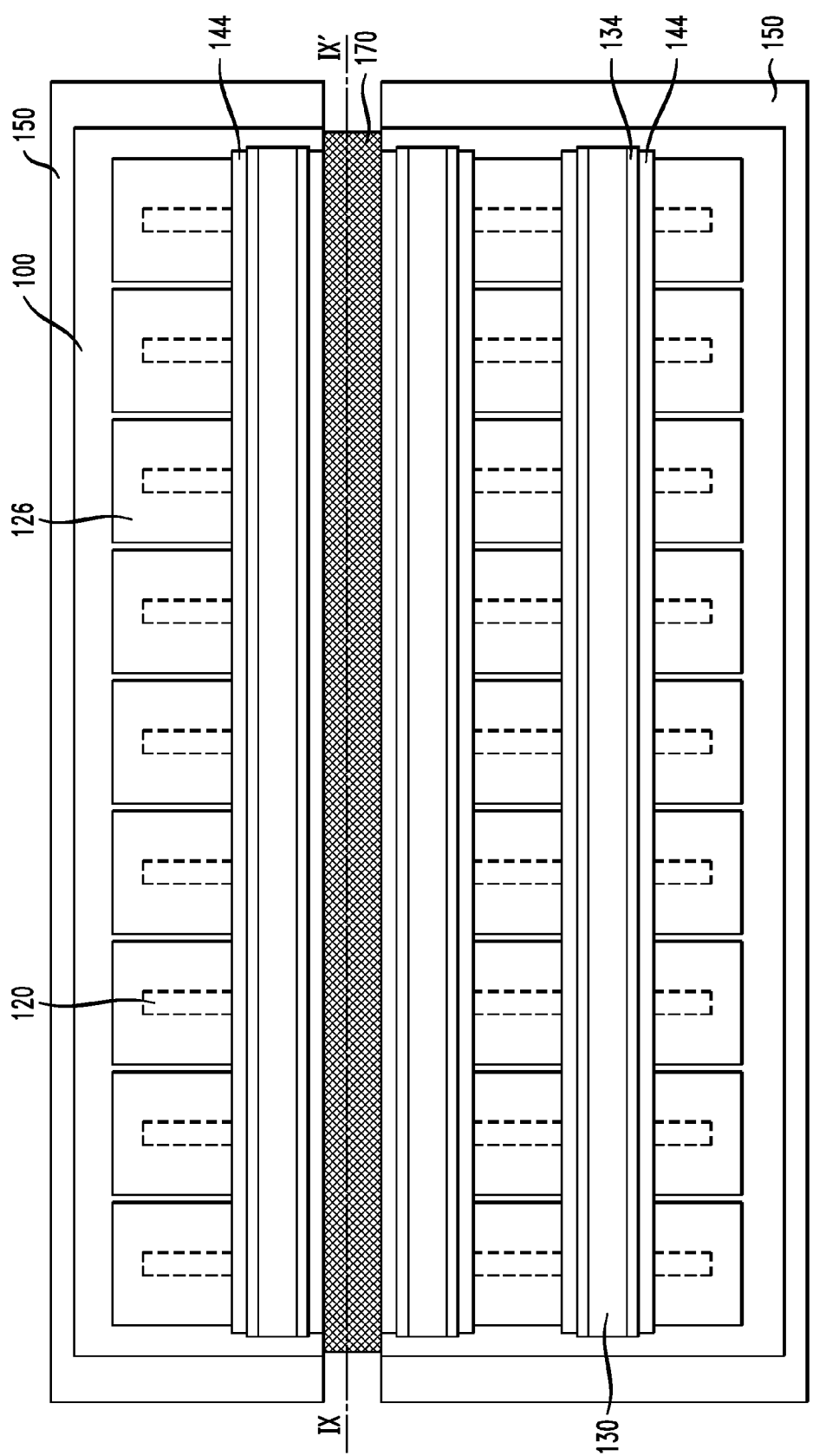
FIGS. 10A and 10B are top and cross-sectional views, respectively, illustrating formation a contact bar on a silicide layer in a method of manufacturing a FinFET device, according to an exemplary embodiment of the invention.
Figure 10B:
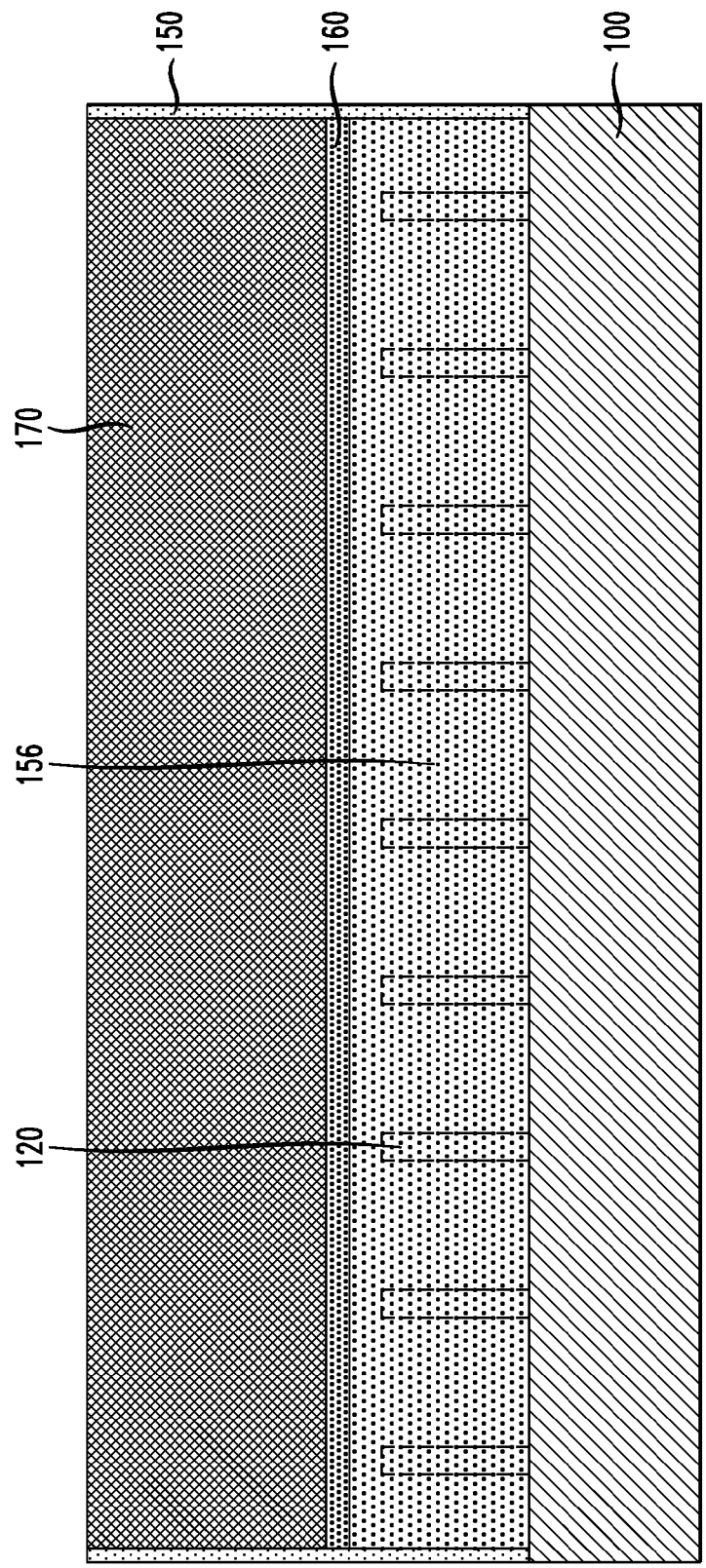
Figure 11A:
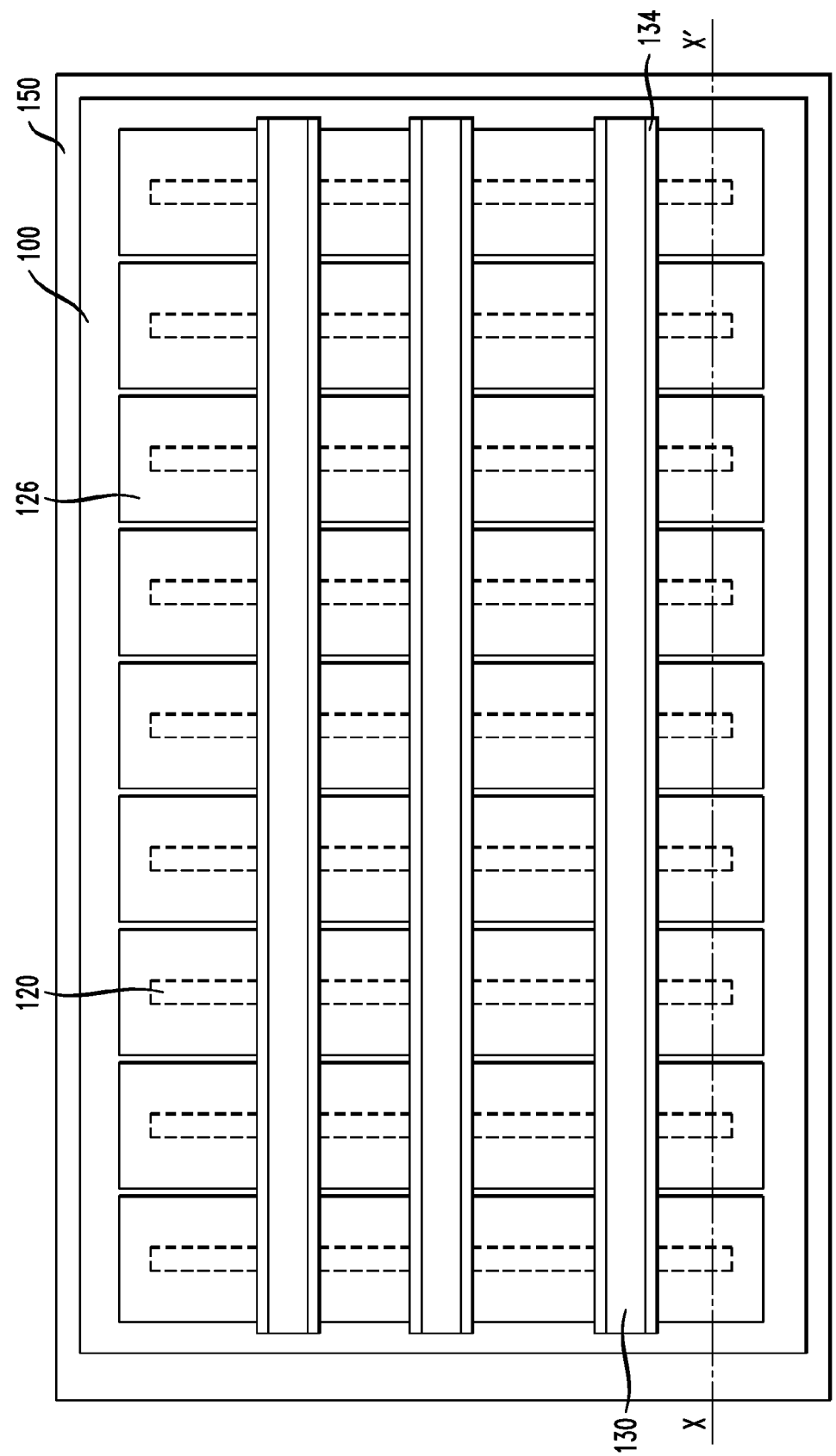
FIGS. 11A and 11B are top and cross-sectional views, respectively, illustrating formation of a middle-of-the-line (MOL) dielectric in a method of manufacturing a FinFET device, according to another exemplary embodiment of the invention.
Figure 11B:
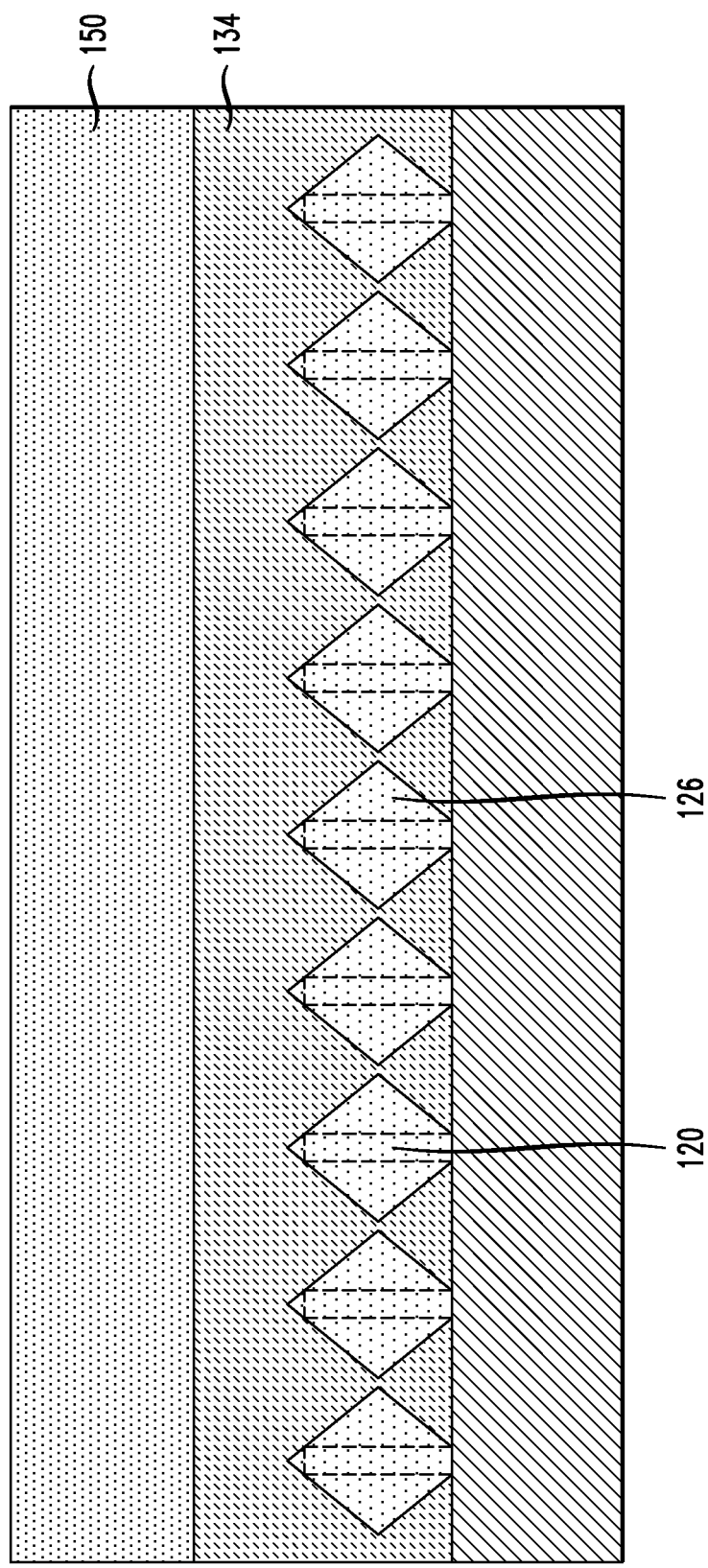
Figure 12A:
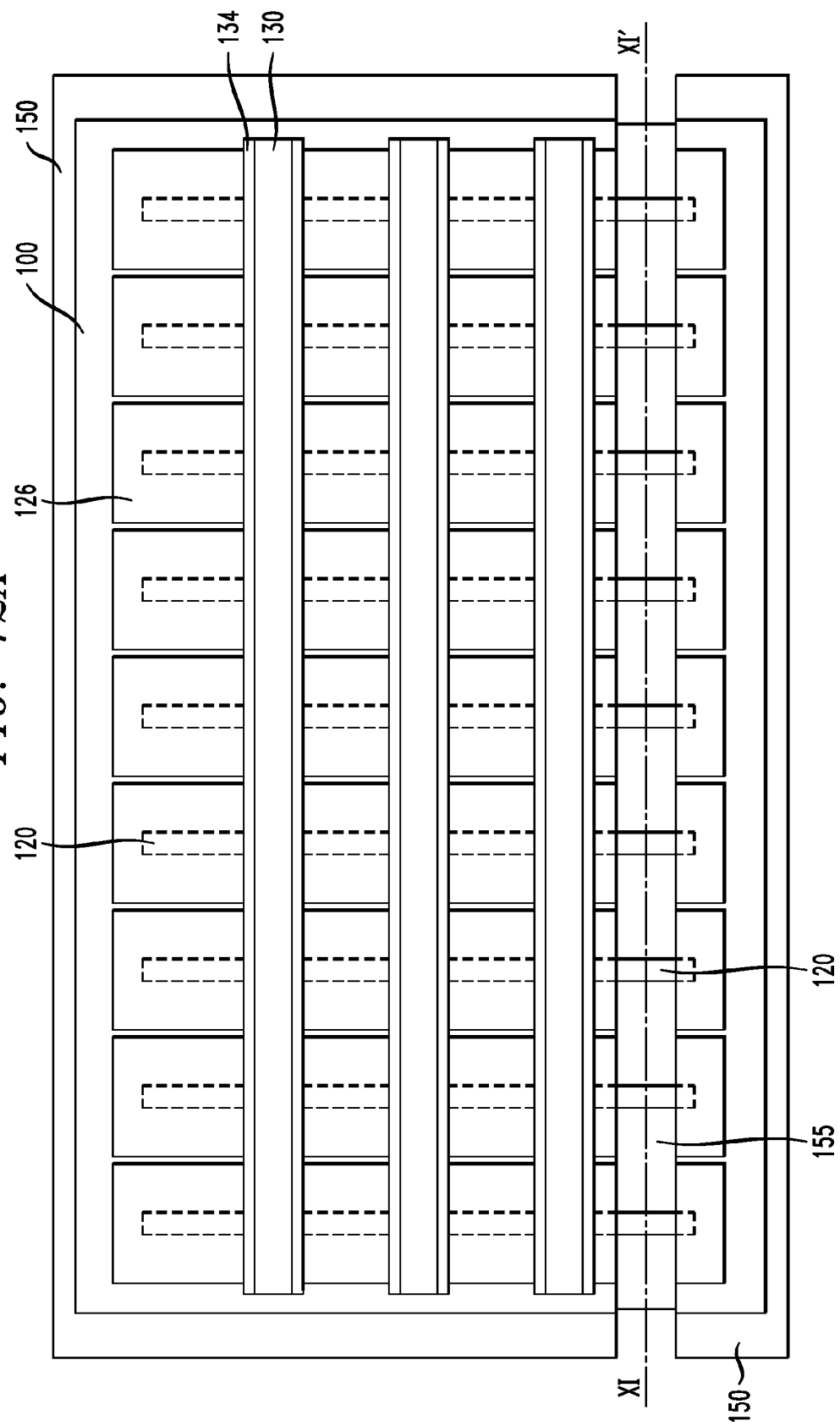
FIGS. 12A and 12B are top and cross-sectional views, respectively, illustrating formation of a contact area trench in a method of manufacturing a FinFET device, according to another exemplary embodiment of the invention.
Figure 12B:
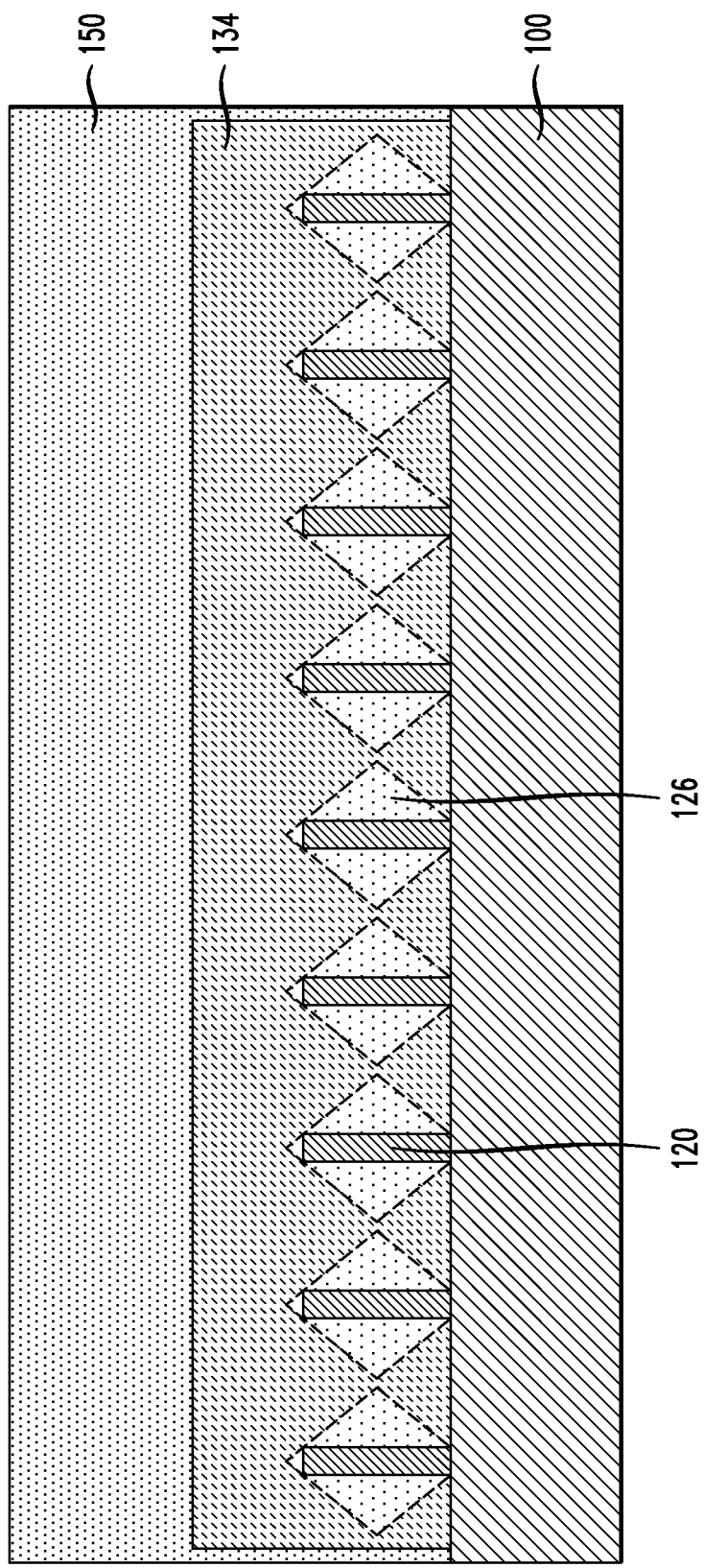
Figure 13A:
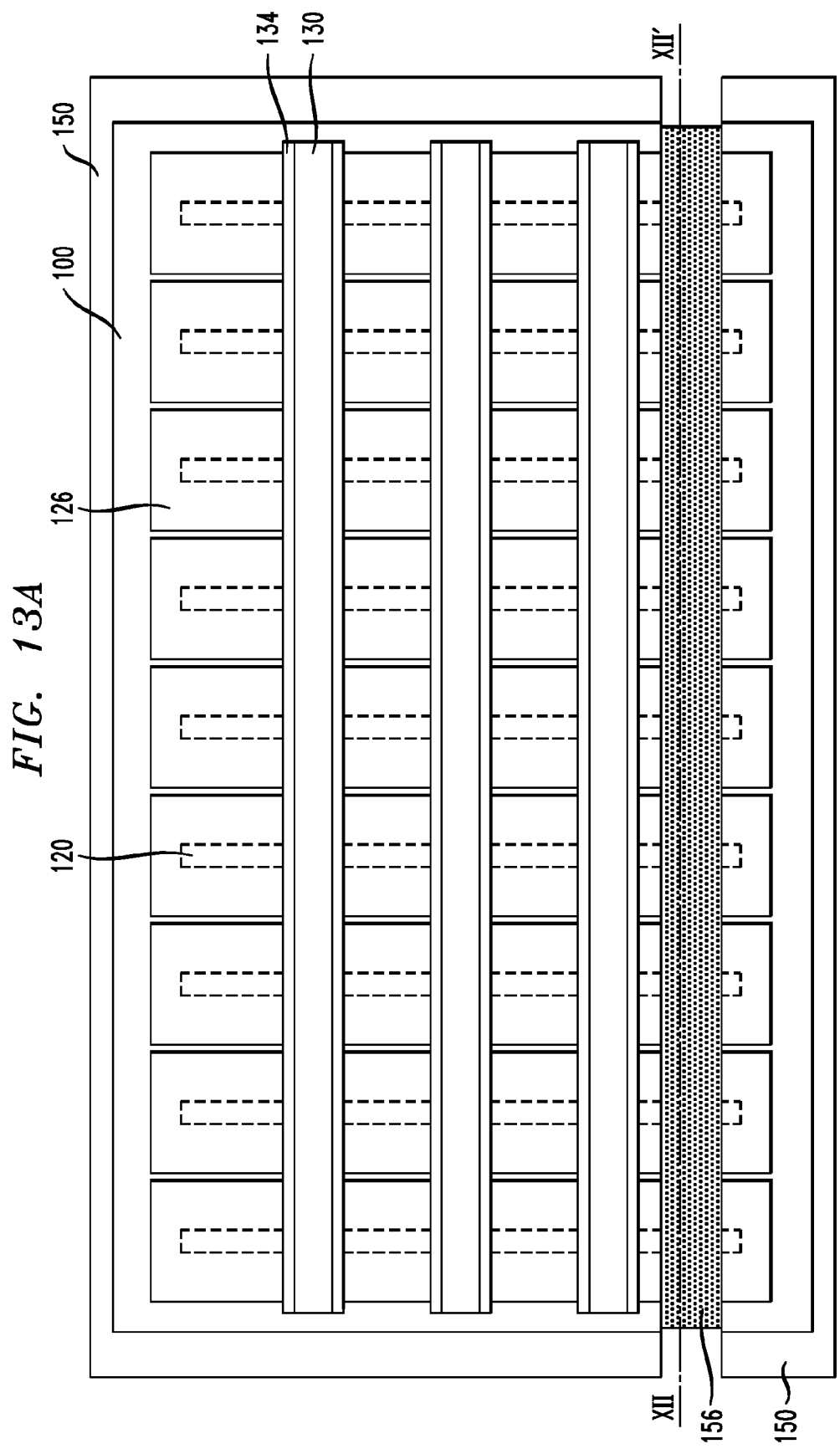
FIGS. 13A and 13B are top and cross-sectional views, respectively, illustrating formation of a merged epitaxy region in a contact area trench in a method of manufacturing a FinFET device, according to another exemplary embodiment of the invention.
Figure 13B:
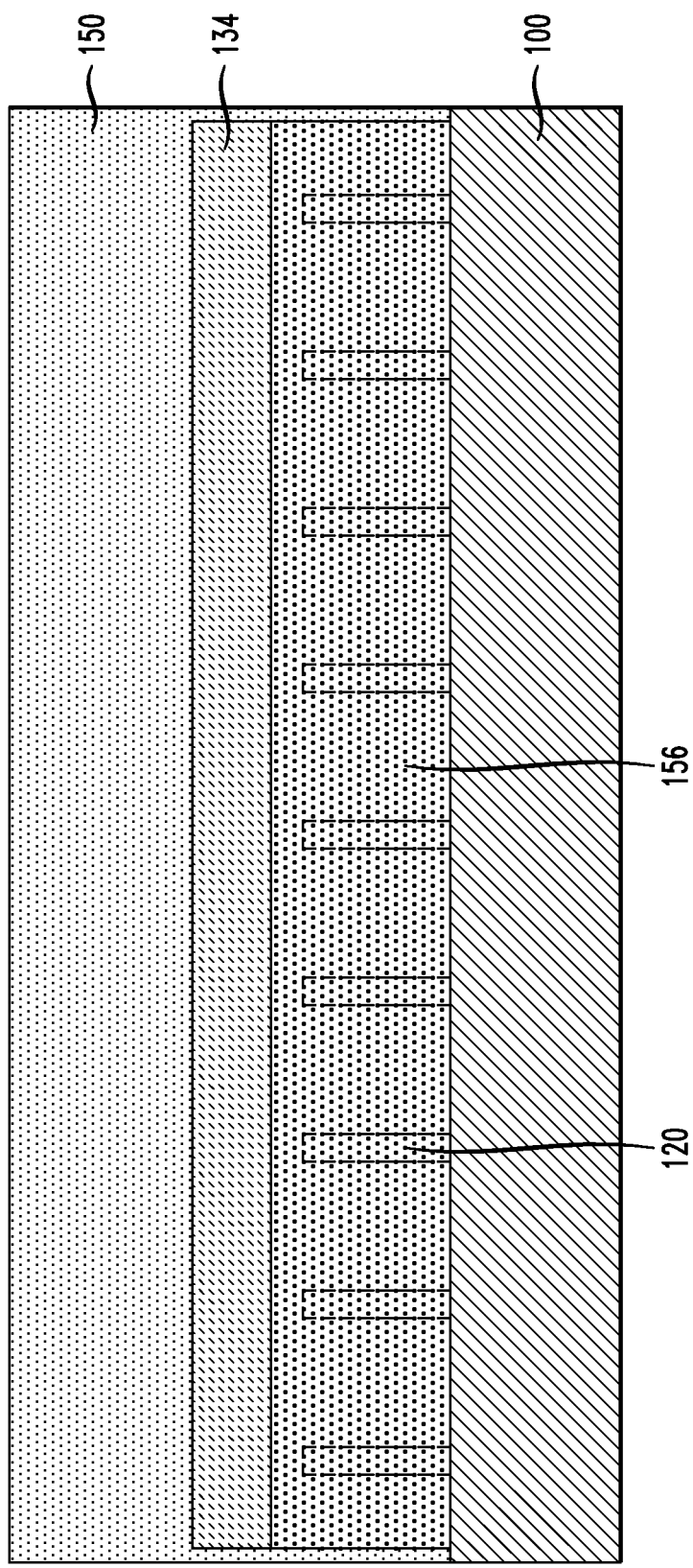

FIGS. 9A and 9B are top and cross-sectional views, respectively, illustrating formation of a silicide layer 160 on the merged epitaxy region 156, and FIGS. 10A and 10B are top and cross-sectional views, respectively, illustrating formation of a contact bar 170 on the silicide layer 160. FIG. 9B is a cross-section taken along line VIII-VIII' in FIG. 9A and FIG. 10B is a cross-section taken along line IX-IX' in FIG. 10A.

After formation of the merged epitaxy region 156 in the contact area trench 155, a silicide layer 160 is formed the merged epitaxy region (or on each of the merged epitaxy regions 156), using, for example, a low temperature annealing process. Then, a CA contact bar 170 is formed on the merged epitaxy region 156 including the silicide layer 160 (or on each of the merged epitaxy regions 156 including the silicide layer 160). The CA contact bar 170 is formed of a metal, including but not limited to, tungsten, or copper, and is deposited using, for example, chemical vapor deposition (CVD), plasma enhanced chemical vapor deposition (PECVD), physical vapor deposition (PVD), sputtering, atomic layer deposition (ALD) or other like deposition processes.

According to an embodiment, a contact bar 170 formed in trench 155 can be formed by depositing a metal silicide-forming metal in trench 155 to result in the silicide layer 160 illustrated in FIGS. 9A and 9B, and subsequently depositing a metal to form the contact bar 170 as shown in FIGS. 10A and 10B. The metal silicide-forming metal, which can be for example, Ni, Pt, Co, and alloys such as NiPt, has an interface with the merged epitaxy 156. An optional diffusion barrier layer such as, for example, TiN or TaN, can be deposited atop the metal silicide-forming metal. When Ni is used, an anneal can be conducted at temperatures in the range of 400° C. to 600° C. Any unreacted portion of the metal silicide-forming metal including the diffusion barrier layer can be removed after forming the silicide 160. Then, a metal, such as, for example, tungsten, is added to form the contact bar 170 as shown in FIGS. 10A and 10B.

Thereafter, in accordance with an embodiment of the present invention, a replacement metal gate (RMG) process can be completed.

In accordance with an embodiment, formation of the second spacer 144 can be omitted. FIGS. 11A, 11B, 12A, 12B, 13A and 13B show similar steps to FIGS. 6A, 6B, 7A, 7B, 8A and 8B, respectively, wherein the formation of the second spacer patterns 144 was omitted.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A fin field-effect transistor (FinFET) device, comprising:
a substrate;
a plurality of fins on the substrate;
a plurality of gate regions on portions of the fins, wherein the gate regions are spaced apart from each other;
spacers on each respective gate region;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions; and
an unmerged epitaxy region on portions of each of the fins between the one or more contact area trenches;
wherein the unmerged epitaxy regions are doped differently than the merged epitaxy regions.

2. The FinFET device according to claim 1, wherein the unmerged epitaxy regions are located under the gate regions and the spacers.

3. The FinFET device according to claim 1, wherein a contact area trench is formed between two adjacent spacers of two adjacent gate regions.

4. The FinFET device according to claim 1, further comprising a silicide layer on each of the merged epitaxy regions in the one or more contact area trenches.

5. The FinFET device according to claim 4, further comprising a contact bar on the silicide layer in the one or more contact area trenches.

6. A fin field-effect transistor (FinFET) device, comprising:
a substrate;
a plurality of fins on the substrate;
a plurality of gate regions on portions of the fins, wherein the gate regions are spaced apart from each other;
spacers on each respective gate region;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions;
an unmerged epitaxy region on portions of each of the fins between the one or more contact area trenches; and
second spacers on the spacers formed on each respective gate region.

7. The FinFET device according to claim 6, wherein a contact area trench is formed between two adjacent second spacers of two adjacent gate regions.

8. A fin field-effect transistor (FinFET) device, comprising:
a substrate;
a plurality of fins on the substrate;
a plurality of gate regions on portions of the fins, wherein the gate regions are spaced apart from each other;
spacers on each respective gate region;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions; and
an unmerged epitaxy region on portions of each of the fins between the one or more contact area trenches;
wherein the unmerged epitaxy regions comprise a different material from the merged epitaxy regions.

9. A fin field-effect transistor (FinFET) device, comprising:
a substrate;
a plurality of fins on the substrate;
a plurality of gate regions on portions of the fins, wherein the gate regions are spaced apart from each other;
spacers on each respective gate region;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions; and
an unmerged epitaxy region on portions of each of the fins between the one or more contact area trenches;
wherein doping levels of the merged and unmerged epitaxy regions are different from each other.

10. A fin field-effect transistor (FinFET) device, comprising:
a substrate;
a plurality of fins on the substrate;
a plurality of gate regions on portions of the fins, wherein the gate regions are spaced apart from each other;
spacers on each respective gate region;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions;
an unmerged epitaxy region on portions of each of the fins between the one or more contact area trenches; and
a contact bar on each of the merged epitaxy regions in the one or more contact area trenches.

11. A fin field-effect transistor (FinFET) device, comprising:
a substrate;
a plurality of fins on the substrate;
a plurality of gate regions on portions of the fins, wherein the gate regions are spaced apart from each other;
spacers on each respective gate region;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions;
an unmerged epitaxy region on portions of each of the fins between the one or more contact area trenches; and
a dielectric layer on the fins between the one or more contact area trenches and not on the fins in the one or more contact area trenches.

12. A fin field-effect transistor (FinFET) device, comprising:
a substrate;
a plurality of fins on the substrate;
a plurality of gate regions on portions of the fins, wherein the gate regions are spaced apart from each other;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions; and
an unmerged epitaxy region on portions of each of the fins between the one or more contact area trenches;
wherein the unmerged epitaxy regions are doped differently than the merged epitaxy regions.

13. The FinFET device according to claim 12, wherein the unmerged epitaxy regions are located under the gate regions.

14. The FinFET device according to claim 12, wherein a contact area trench is formed between two adjacent gate regions.

15. A fin field-effect transistor (FinFET) device, comprising:
a substrate;
a plurality of fins on the substrate;
a plurality of gate regions on portions of the fins, wherein the gate regions are spaced apart from each other;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions; and
an unmerged epitaxy region on portions of each of the fins between the one or more contact area trenches;
wherein the unmerged epitaxy regions comprise a different material from the merged epitaxy regions.

16. A fin field-effect transistor (FinFET) device, comprising:
a substrate;
a plurality of fins on the substrate;
a plurality of gate regions on portions of the fins, wherein the gate regions are spaced apart from each other;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions; and
an unmerged epitaxy region on portions of each of the fins between the one or more contact area trenches;
wherein doping levels of the merged and unmerged epitaxy regions are different from each other.

17. A fin field-effect transistor (FinFET) device, comprising:
a substrate;
a plurality of fins on the substrate;
a plurality of gate regions on portions of the fins, wherein the gate regions are spaced apart from each other;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions;
an unmerged epitaxy region on portions of each of the fins between the one or more contact area trenches; and
a contact bar on each of the merged epitaxy regions in the one or more contact area trenches.

18. A fin field-effect transistor (FinFET) device, comprising:
a substrate;
a plurality of fins on the substrate;
a plurality of gate regions on portions of the fins, wherein the gate regions are spaced apart from each other;
one or more contact area trenches respectively formed at one or more portions between adjacent gate regions;
an epitaxy region on each of the fins in the one or more contact area trenches, wherein the epitaxy regions on adjacent fins in the one or more contact area trenches are merged with each other to form merged epitaxy regions;
an unmerged epitaxy region on portions of each of the fins between the one or more contact area trenches; and
a dielectric layer on the fins between the one or more contact area trenches and not on the fins in the one or more contact area trenches.

* * * * *